US010216090B2

(12) United States Patent
Meya et al.

(10) Patent No.: US 10,216,090 B2
(45) Date of Patent: Feb. 26, 2019

(54) PATTERN-FORMING METHOD AND COMPOSITION FOR RESIST PATTERN-REFINEMENT

(71) Applicant: JSR CORPORATION, Tokyo (JP)

(72) Inventors: Kanako Meya, Tokyo (JP); Yusuke Anno, Tokyo (JP); Ken Maruyama, Tokyo (JP); Shuto Mori, Tokyo (JP)

(73) Assignee: JSR CORPORATION, Tokyo (JP)

( * ) Notice: Subject to any disclaimer, the term of this patent is extended or adjusted under 35 U.S.C. 154(b) by 120 days.

(21) Appl. No.: 15/082,389

(22) Filed: Mar. 28, 2016

(65) Prior Publication Data

US 2016/0291462 A1 Oct. 6, 2016

(30) Foreign Application Priority Data

Mar. 31, 2015 (JP) ................................. 2015-074644
Mar. 9, 2016 (JP) ................................. 2016-046167

(51) Int. Cl.
*G03F 7/40* (2006.01)
*H01L 21/027* (2006.01)
*G03F 7/039* (2006.01)
*G03F 7/32* (2006.01)

(52) U.S. Cl.
CPC .............. *G03F 7/40* (2013.01); *G03F 7/0397* (2013.01); *G03F 7/325* (2013.01); *G03F 7/405* (2013.01); *H01L 21/0273* (2013.01)

(58) Field of Classification Search
CPC ................................ G03F 7/40; G03F 7/0397
See application file for complete search history.

(56) References Cited

U.S. PATENT DOCUMENTS

| | | | | |
|---|---|---|---|---|
| 4,910,122 A | 3/1990 | Arnold et al. | | |
| 8,431,329 B2 * | 4/2013 | Bae | G03F 7/0035 430/270.1 | |
| 2015/0072536 A1 * | 3/2015 | Muramatsu | G03F 7/40 438/781 | |

FOREIGN PATENT DOCUMENTS

| | | |
|---|---|---|
| JP | H05-188598 A | 7/1993 |
| JP | 2005-352384 A | 12/2005 |
| JP | 2008-310314 A | 12/2008 |
| JP | 2013-117710 A | 6/2013 |
| JP | 2013-257435 A | 12/2013 |

* cited by examiner

*Primary Examiner* — Kathleen Duda
(74) *Attorney, Agent, or Firm* — Oblon, McClelland, Maier & Neustadt, L.L.P.

(57) ABSTRACT

A pattern-forming method comprises forming a prepattern that is insoluble or hardly soluble in an organic solvent. A first composition is applied on at least lateral faces of the prepattern to form a resin layer. Adjacent regions to the prepattern of the resin layer are insolubilized or desolubilized in the organic solvent without being accompanied by an increase in a molecular weight by heating the prepattern and the resin layer. Regions other than the adjacent regions insolubilized or desolubilized of the resin layer are removed with the organic solvent. The first composition comprises a first polymer having a solubility in the organic solvent to be decreased by an action of an acid. At least one selected from the following features (i) and (ii) is satisfied: (i) the first polymer comprises a basic group; and (ii) the first composition further comprises a basic compound.

14 Claims, 1 Drawing Sheet

PATTERN-FORMING METHOD AND COMPOSITION FOR RESIST PATTERN-REFINEMENT

CROSS-REFERENCE TO RELATED APPLICATIONS

The present application claims priority to Japanese Patent Application No. 2015-074644, filed Mar. 31, 2015, and to Japanese Patent Application No. 2016-046167, filed Mar. 9, 2016. The contents of these applications are incorporated herein by reference in their entirety.

BACKGROUND OF THE INVENTION

Field of the Invention

The present invention relates to a pattern-forming method and a composition for resist pattern-refinement.

Discussion of the Background

Miniaturization of structures of various types of electronic devices such as semiconductor devices and liquid crystal devices has been accompanied by demands for microfabrication of patterns in lithography processes. To address such demands, a method of forming a pattern by exposing and developing a resist film formed using a resist composition containing a radiation-sensitive acid generator and a polymer having a solubility in a developer solution that will be altered by the action of an acid, and additionally a method in which further refining is attempted based on the pattern thus formed have been studied.

Such a method is exemplified by a known technique which includes subjecting a formed pattern (prepattern) to an action of a crosslinking layer-forming material, thereby permitting crosslinkage of the crosslinking layer-forming material with a resin constituting the pattern to form a crosslinking layer (see Japanese Unexamined Patent Application, Publication No. 2008-310314). Further, a technique which includes: applying a coating-forming agent on a resist pattern; then heating to form a layer that is hardly soluble in a developer solution without being accompanied by an increase in the molecular weight on the surface of the resist pattern, so as to increase the thickness of the pattern has been studied (see Japanese Unexamined Patent Application, Publication No. 2013-117710). Furthermore, a technique of increasing the thickness of a pattern by forming a film on a negative pattern using a composition containing a compound having a solubility in a removing liquid containing an organic solvent that will be increased by the action of an acid through an increase in the polarity has been studied (see Japanese Unexamined Patent Application, Publication No. 2013-257435).

SUMMARY OF THE INVENTION

According to one aspect of the present invention, a pattern-forming method comprises forming a prepattern that is insoluble or hardly soluble in an organic solvent. A first composition is applied on at least lateral faces of the prepattern to form a resin layer. Adjacent regions to the prepattern of the resin layer are insolubilized or desolubilized in the organic solvent without being accompanied by an increase in a molecular weight by heating the prepattern and the resin layer. Regions other than the adjacent regions insolubilized or desolubilized of the resin layer are removed with the organic solvent. The first composition comprises a first polymer having a solubility in the organic solvent to be decreased by an action of an acid. At least one selected from the following features (i) and (ii) is satisfied: (i) the first polymer comprises a basic group; and (ii) the first composition further comprises a basic compound.

According to another aspect of the present invention, a pattern-forming method comprises forming a prepattern that is insoluble or hardly soluble in an organic solvent. At least lateral faces of the prepattern are brought into contact with a composition which comprises a basic compound and an organic solvent and which does not comprise a polymer having a solubility in an organic solvent to be decreased by an action of an acid. A composition is applied on at least lateral faces of the prepattern to form a resin layer. The composition comprises a polymer having a solubility in the organic solvent to be decreased by an action of an acid. The polymer has a weight average molecular weight of no less than 13,000 and no greater than 150,000. Adjacent regions to the prepattern of the resin layer are insolubilized or desolubilized in the organic solvent without being accompanied by an increase in a molecular weight by heating the prepattern and the resin layer. Regions other than the adjacent regions insolubilized or desolubilized of the resin layer are removed with the organic solvent.

According further aspect of the present invention, a resist pattern-refinement composition comprises a polymer having a solubility in an organic solvent to be decreased by an action of an acid.

According further aspect of the present invention, a resist pattern-refinement composition comprises a polymer having a solubility in an organic solvent to be decreased by an action of an acid; and a basic compound.

According further aspect of the present invention, a resist pattern-refinement composition comprises a basic compound and an organic solvent, and not comprises a polymer having a solubility in an organic solvent to be decreased by an action of an acid.

DESCRIPTION OF THE PREFERRED EMBODIMENTS

Figure 1A:
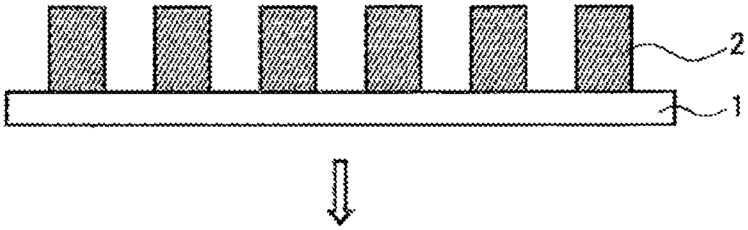
FIGS. 1A to 1D show a schematic view illustrating one embodiment of the pattern-forming method of the present invention.

According to an embodiment of the invention made for solving the aforementioned problems, a pattern-forming method includes the steps of: forming a prepattern that is insoluble or hardly soluble in an organic solvent (hereinafter, may be also referred to as "prepattern-forming step"); forming a resin layer on at least lateral faces of the prepattern (hereinafter, may be also referred to as "resin layer-forming step"); insolubilizing or desolubilizing in the organic solvent, adjacent regions to the prepattern of the resin layer without being accompanied by an increase in the molecular weight by heating the prepattern and the resin layer (hereinafter, may be also referred to as "insolubilizing or desolubilizing step"); and removing regions other than the adjacent regions insolubilized or desolubilized of the resin layer with the organic solvent (hereinafter, may be also referred to as "removing step"), wherein the resin layer is formed from a first composition (hereinafter, may be also referred to as "composition (I)") which contains a first polymer (hereinafter, may be also referred to as "polymer (I)") having a solubility in the organic solvent to be decreased by an action of an acid, and which involves at least one selected from the following features (i) and (ii):

(i) the first polymer having a basic group; and (ii) the first composition further containing a basic compound.

In addition, according to another embodiment of the invention, a pattern-forming method (hereinafter, may be also referred to as "pattern-forming method (a)") includes the steps of: forming a prepattern that is insoluble or hardly soluble in an organic solvent; forming a prepattern that is insoluble or hardly soluble in the organic solvent; bringing into contact with at least lateral faces of the prepattern, a composition which contains a basic compound and an organic solvent and which does not contain a polymer having a solubility in the organic solvent to be decreased by an action of an acid; forming a resin layer on at least lateral faces of the prepattern; insolubilizing or desolubilizing in the organic solvent, adjacent regions to the prepattern of the resin layer without being accompanied by an increase in the molecular weight by heating the prepattern and the resin layer; and removing regions other than the adjacent regions insolubilized or desolubilized of the resin layer with the organic solvent, wherein the resin layer is formed from a composition which contains a polymer having a solubility in the organic solvent to be decreased by an action of an acid, and the polymer has a weight average molecular weight of no less than 13,000 and no greater than 150,000.

Moreover, still other embodiments of the invention are directed to:

a composition for resist pattern-refinement which contains a polymer having a basic group and having a solubility in an organic solvent to be decreased by an action of an acid;

a composition for resist pattern-refinement which contains a polymer having a solubility in an organic solvent to be decreased by an action of an acid, and a basic compound; and a composition for resist pattern-refinement which contains a basic compound and an organic solvent, and does not contain a polymer having a solubility in the organic solvent to be decreased by an action of an acid.

According to the pattern-forming methods and the compositions for resist pattern-refinement of the embodiments of the present invention, a resist pattern having a fine and favorable shape can be formed substantially irrespective of the pattern type by a convenient process. Therefore, these can be suitably used for pattern formation in the fields of semiconductor processing and the like in which further progress of miniaturization is expected in the future. Hereinafter, the embodiments will be explained in detail.

Pattern-Forming Method

Hereinafter, the pattern-forming method of an embodiment of the present invention will be described with reference to FIGS. 1A to 1D. The pattern-forming method includes the prepattern-forming step, the resin layer-forming step, the insolubilizing or desolubilizing step, and the removing step. The pattern-forming method preferably includes after the prepattern-forming step and before the resin layer-forming step, the step of bringing into contact with at least lateral faces of the prepattern, a second composition (hereinafter, may be also referred to as "composition (II)") which contains a basic compound and an organic solvent and which does not contain a polymer having a solubility in the organic solvent to be decreased by an action of an acid (hereinafter, may be also referred to as "contacting step"). It is preferred that the pattern-forming method further includes after the removing step, the step of rinsing with an organic solvent that is different from the organic solvent used in the removing step (hereinafter, may be also referred to as "rinsing step"). Hereinafter, each step will be described.

Prepattern-Forming Step

In this step, a prepattern that is insoluble or hardly soluble in an organic solvent is formed. According to this step, a prepattern 2 is formed on a as shown in FIG. 1A. The phrase "insoluble or hardly soluble (insolubilized or desolubilized) in an (the) organic solvent" as referred to means that the solubility is low to an extent that the shape of the prepattern is substantially maintained.

The organic solvent is exemplified by an alcohol solvent, an ether solvent, a ketone solvent, an amide solvent, an ester solvent, a hydrocarbon solvent, and the like.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol and benzyl alcohol and, diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether; and the like.

Examples of the ether solvent include:

dialiphatic ethers such as diethyl ether, dipropyl ether and dibutyl ether;

diaromatic ethers such as diphenyl ether and ditolyl ether;

aromatic-aliphatic ethers such as anisole and phenyl ethyl ether; and the like.

Examples of the ketone solvent include:

aliphatic ketone solvents such as acetone, methyl ethyl ketone, methyl-n-propyl ketone, methyl-n-butyl ketone, diethyl ketone, methyl-iso-butyl ketone, methyl amyl ketone, ethyl-n-butyl ketone, methyl-n-hexyl ketone, di-iso-butyl ketone, trimethylnonanone, cyclopentanone, cyclohexanone, cycloheptanone, cyclooctanone, methylcyclohexanone, 2,4-pentanedione, acetonylacetone and acetophenone;

aliphatic-aromatic ketone solvents such as acetophenone, propiophenone and tolylmethyl ketone;

aromatic ketone solvents such as benzophenone, tolyl phenyl ketone and ditolyl ketone; and the like.

Examples of the amide solvent include:

N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ester solvent include:

monoester solvents such as methyl acetate, ethyl acetate, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, methoxytriglycol acetate, ethyl propionate, n-butyl propionate, iso-amyl propionate, methyl lactate, ethyl lactate, n-butyl lactate and n-amyl lactate;

diester solvents such as glycol diacetate, diethyl oxalate, di-n-butyl oxalate, diethyl malonate, dimethyl phthalate and diethyl phthalate;

polyhydric alcohol mono ether acetate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate and dipropylene glycol monoethyl ether acetate;

lactone solvents such as γ-butyrolactone and γ-valerolactone;

carbonate solvents such as diethyl carbonate, dipropyl carbonate, ethylene carbonate and propylene carbonate; and the like.

Examples of the hydrocarbon solvent include:

aliphatic hydrocarbon solvents such as n-pentane, iso-pentane, n-hexane, iso-hexane, n-heptane, iso-heptane, 2,2,4-trimethylpentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene; and the like.

Of these, ether solvents, ketone solvents and ester solvents are preferred. The ether solvent is more preferably an aromatic-aliphatic ether solvent, and particularly preferably anisole. The ketone solvent is more preferably an aliphatic ketone solvent, and particularly preferably methyl amyl ketone. The ester solvent is more preferably a monoester solvent, and particularly preferably butyl acetate. These organic solvents may be used in combination of or two or more types thereof.

It is preferred that the prepattern contains an acid. When the prepattern contains an acid, the acid can be diffused from the prepattern into the resin layer and act therein as described later, thereby enabling more effective pattern-formation to be executed.

The prepattern-forming step preferably includes the steps of: forming a resist film from a resist composition containing: a second polymer (hereinafter, may be also referred to as "(a) polymer" or "polymer (a)") having a solubility in the organic solvent to be decreased by the action of the acid, a radiation-sensitive acid generator (hereinafter, may be also referred to as "(b) acid generator" or "acid generator (b)") and a solvent (hereinafter, may be also referred to as "(c) solvent" or "solvent (c)") (hereinafter, may be also referred to as "resist film-forming step"); exposing the resist film (hereinafter, may be also referred to as "exposure step"); and developing the exposed resist film with a developer solution containing the organic solvent (hereinafter, may be also referred to as "development step"). Formation of the prepattern by the method having each step described above enables the prepattern to contain the acid generated from the acid generator (b) upon the exposure in the exposure step, and consequently, the pattern-forming method can be more effectively performed. Each step will be described below.

Resist Film-Forming Step

In this step, the resist film is formed from the resist composition containing the polymer (a), the acid generator (b) and the solvent (c). The resist composition will be described later.

The substrate on which the resist film is formed is exemplified by a conventionally well-known substrate such as a silicon wafer, a wafer coated with silicon dioxide or aluminum, and the like. In addition, an organic or inorganic antireflective film disclosed in, for example, Japanese Examined Patent Application, Publication No. H6-12452, Japanese Unexamined Patent Application, Publication No. S59-93448, or the like may be formed on the substrate. An application procedure is exemplified by spin-coating, cast coating, roll-coating, and the like. After the application, soft baking (SB) may be carried out as needed for evaporating the solvent remaining in the coating film. The temperature for SB is typically no less than 60° C., and preferably no less than 80° C. The temperature for SB is typically no greater than 140° C., and preferably no greater than 120° C. The time period for SB is typically no less than 5 sec, and preferably no less than 10 sec. On the other hand, the time period for PB is typically no greater than 600 sec, and preferably no greater than 300 sec. The film thickness of the resist film formed is preferably no less than 10 nm, whereas the film thickness is preferably no greater than 1,000 nm and, and more preferably no greater than 500 nm.

In order to preclude influences from basic impurities and the like contained in the environmental atmosphere, a protective film disclosed in, for example, Japanese Unexamined Patent Application, Publication No. H5-188598 and the like may be also provided on the resist film. Moreover, in order to prevent the leakage of the acid generator, etc., from the resist film, a protective film for liquid immersion disclosed in, for example, Japanese Unexamined Patent Application, Publication No. 2005-352384 and the like may be also provided on the resist film. It is to be noted that these techniques may be used in combination.

Exposure Step

In this step, the resist film formed in the resist film-forming step is exposed. The exposure is carried out by irradiating the resist film with a radioactive ray through a photomask (through a liquid immersion medium such as water, as needed). Examples of the radioactive ray include: electromagnetic waves such as visible light rays, ultraviolet rays, far ultraviolet rays, X-rays and γ radiations; charged particle beams or charged particle rays such as electron beams and α-rays; and the like, in accordance with the line width of the intended pattern. Of these, far ultraviolet rays and electron beams are preferred, an ArF excimer laser beam (wavelength: 193 nm), a KrF excimer laser beam (wavelength: 248 nm) and electron beams are more preferred, and an ArF excimer laser beam and electron beams are still more preferred.

The exposure procedure may be appropriately selected depending on the shape and the like of the resist pattern desired. For example, an isolated trench (iso-trench) pattern can be formed by carrying out exposure at a desired region through a mask of an isolated line (iso-line) pattern. Also, the exposure may be carried out at least twice. When the exposure is carried out at least twice, the twice exposures are preferably carried out continuously. When the exposure is carried out a plurality of times, for example, the first exposure is carried out through a line-and-space pattern mask at a desired region, and subsequently the second exposure is carried out such that lines cross over light-exposed regions subjected to the first exposure. The first light-exposed regions are preferably orthogonal to the second light-exposed regions. Due to the first light-exposed region and the second light-exposed region being orthogonal with each other, a perfect circular contact hole pattern can be easily formed at light-unexposed regions surrounded by light-exposed regions.

In a case where the exposure is carried out by liquid immersion lithography, examples of the liquid immersion liquid for use in the exposure include water, fluorine-containing inert liquids, and the like. It is preferred that the liquid immersion liquid is transparent to an exposure wavelength, and has a temperature coefficient of the refractive index as small as possible so that distortion of an optical image projected onto the film is minimized. In particular, when an ArF excimer laser beam (wavelength: 193 nm) is used as an exposure light source, it is preferred to use water in light of availability and ease of handling thereof in addition to the aforementioned considerations. When water is used, a slight amount of an additive which reduces the surface tension of water and imparts enhanced surfactant power may be added. It is preferred that the additive hardly dissolves a resist film on a wafer and has a negligible influence on an optical coating of an inferior face of a lens. The water for use is preferably distilled water.

It is preferred that post exposure baking (PEB) is carried out after the exposure to promote dissociation of the acid-labile group included in the polymer (a), etc. mediated by the acid generated from the acid generator (b) upon the exposure in exposed regions of the resist film. This PEB produces a difference in solubility of the resist film in a developer solution between the light-exposed regions and light-unexposed regions. The temperature for PEB is typically no less than 50° C., and preferably no less than 80° C. On the other hand, the temperature for PEB is typically no greater than 180° C., and preferably no greater than 130° C. The time period for PEB is typically no less than 5 sec, and preferably no less than 10 sec. On the other hand, the time period for PEB is typically no greater than 600 sec, and preferably no greater than 300 sec.

Development Step

In this step, the resist film exposed above is developed with a developer solution containing the organic solvent. Accordingly, a predetermined resist pattern is formed. The development is typically followed by washing with a rinse agent such as water or alcohol, and drying.

The organic solvent contained in the developer solution is exemplified by solvents similar to those exemplified as the organic solvent in the prepattern-forming step, and the like. Of these, the ether solvent, the ester solvent and the ketone solvent are preferred. The ether solvent is preferably an aromatic ring-containing ether solvent, and more preferably anisole. The ester solvent is preferably an acetic acid ester solvent, and more preferably n-butyl acetate. The ketone solvent is preferably a chain ketone, and more preferably 2-heptanone.

The content of the organic solvent in the developer solution is preferably no less than 80% by mass, more preferably no less than 90% by mass, still more preferably no less than 95% by mass, and particularly preferably no less than 99% by mass. When the content of the organic solvent in the developer solution falls within the above range, a contrast between the light-exposed regions and light-unexposed regions can be improved. It is to be noted that a component other than the organic solvent is exemplified by water, silicone oil, and the like.

The developer solution may contain, as needed, a surfactant in an appropriate amount. As the surfactant, for example, an ionic/nonionic fluorine and/or silicon surfactant, etc., may be used.

Examples of the development procedure include: a dipping procedure in which the substrate is immersed for a given time period in the developer solution charged in a container; a puddle procedure in which the developer solution is placed to form a dome-shaped bead by way of the surface tension on the surface of the substrate for a given time period to conduct a development; a spraying procedure in which the developer solution is sprayed onto the surface of the substrate; a dynamic dispensing procedure in which the developer solution is continuously applied onto the substrate that is rotated at a constant speed while scanning with a developer solution-application nozzle at a constant speed; and the like.

The resist film after the development is preferably rinsed with a rinse agent. Also as the rinse agent in the rinsing step, an organic solvent may be used, whereby scums which may be generated can be efficiently washed away. The rinse agent is preferably a hydrocarbon solvent, a ketone solvent, an ester solvent, an alcohol solvent, an amide solvent, or the like. Of these, the alcohol solvent and the ester solvent are preferred, and a monovalent alcohol solvent having 6 to 8 carbon atoms is more preferred. The monovalent alcohol having 6 to 8 carbon atoms is exemplified linear, branched or cyclic monovalent alcohols, and examples thereof include 1-hexanol, 1-heptanol, 1-octanol, 4-methyl-2-pentanol, 2-hexanol, 2-heptanol, 2-octanol, 3-hexanol, 3-heptanol, 3-octanol, 4-octanol, benzyl alcohol, and the like. Of these, 1-hexanol, 2-hexanol, 2-heptanol and 4-methyl-2-pentanol are preferred, and 4-methyl-2-pentanol is more preferred.

Each component of the rinse agent may be used either alone, or in combination of two or more thereof. The moisture content in the rinse agent is preferably no greater than 10% by mass, more preferably no greater than 5% by mass, and still more preferably no greater than 3% by mass. When the moisture content falls within the above range, favorable development characteristics can be attained. It is to be noted that a surfactant may be also added to the rinse agent.

The procedure for rinsing with the rinse agent is exemplified by: a procedure in which the rinse agent is continuously applied onto the substrate that is rotated at a constant speed (spin-coating procedure); a procedure in which the substrate is immersed in a bath filled with the rinse agent for a given time period (dip coating procedure), a procedure in which the rinse agent is sprayed on the surface of the substrate (spray coating procedure), and the like.

The prepattern formed in this step is exemplified by a line-and-space pattern, a hole pattern and the like.

Resist Composition

The resist composition contains the polymer (a), the acid generator (b) and the solvent (c). In addition to the components (a) to (c), the resist composition may also contain (d) a polymer having a greater percentage content of fluorine atoms than that of the polymer (a) (hereinafter, may be also referred to as "(d) polymer" or "polymer (d)") and (e) an acid diffusion controller, as well as other component(s) than these components. Hereinafter, each component will be described.

(a) Polymer

The polymer (a) has a solubility in the organic solvent to be decreased by an action of an acid. The polymer (a) is not particularly limited as long as the above feature is exhibited, and is exemplified by a polymer having an acid-labile group (hereinafter, may be also referred to as "polymer (a')"), and the like. The "acid-labile group" as referred to means a group that substitutes for the hydrogen atom of the acidic group such as a carboxy group or a hydroxy group and is dissociated by the action of an acid. When the polymer (a') is employed as the polymer (a), a pattern having a more favorable shape can be formed according to the pattern-forming method.

Structural Unit (I)

The polymer (a') preferably has a structural unit (hereinafter, may be also referred to as "structural unit (I)") that includes an acid-labile group. The structural unit (I) is exemplified by a structural unit represented by the following formula (1) and the like.

(1)

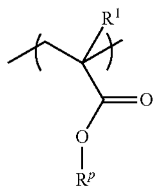

In the above formula (1), $R^1$ represents a hydrogen atom, a fluorine atom, a methyl group or a trifluoromethyl group; and $R^p$ represents a monovalent acid-labile group.

The monovalent acid-labile group represented by $R^p$ is preferably a group represented by the following formula (i).

(i)

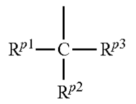

In the above formula (i), $R^{p1}$ represents a monovalent hydrocarbon group having 1 to 20 carbon atoms; and $R^{p2}$ and $R^{p3}$ each independently represent a monovalent chain hydrocarbon group having 1 to 20 carbon atoms or a monovalent alicyclic hydrocarbon having 3 to 20 carbon atoms, or $R^{p2}$ and $R^{p3}$ taken together represent an alicyclic structure having 3 to 20 ring atoms together with the carbon atom to which $R^{p2}$ and $R^{p3}$ bond.

The monovalent hydrocarbon group having 1 to 20 carbon atoms represented by $R^{p1}$ is exemplified by a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

Examples of the monovalent chain hydrocarbon group having 1 to 20 carbon atoms which may be represented by $R^{p1}$, $R^{p2}$ and $R^{p3}$ include a methyl group, an ethyl group, a n-propyl group, an i-propyl group, a n-butyl group, a 2-methylpropyl group, a 1-methylpropyl group, a t-butyl group and the like.

Examples of the monovalent alicyclic hydrocarbon group having 3 to 20 carbon atoms which may be represented by $R^{p1}$, $R^{p2}$ and $R^{p3}$ include:

cycloalkyl groups such as a cyclopropyl group, a cyclobutyl group, a cyclopentyl group, a cyclohexyl group, a cycloheptyl group, a cyclooctyl group, a cyclodecyl group, a cyclododecyl group, a norbornyl group, an adamantyl group, a tricyclodecyl group and a tetracyclododecyl group;

cycloalkenyl groups such as a cyclopropenyl group, a cyclobutenyl group, a cyclopentenyl group, a cyclohexenyl group, a cyclooctenyl group, a cyclodecenyl group, a norbornenyl group, a tricyclodecenyl group and a tetracyclododecenyl group; and the like.

Examples of the monovalent aromatic hydrocarbon group having 6 to 20 carbon atoms which may be represented by $R^{p1}$, $R^{p2}$ and $R^{p3}$ include:

aryl groups such as a phenyl group, a tolyl group, a xylyl group, a naphthyl group and an anthryl group;

aralkyl groups such as a benzyl group, a phenethyl group and a naphthylmethyl group; and the like.

Among these, it is preferred that $R^{p1}$ represents a monovalent chain hydrocarbon group having 1 to 10 carbon atoms; and $R^{p2}$ and $R^{p3}$ taken together represent an adamantane structure or a cycloalkane structure together with the carbon atom to which $R^{p2}$ and $R^{p3}$ bond.

The structural unit (I) is exemplified by structural units represented by the following formulae (1-1) to (1-4), and the like.

(1-1)

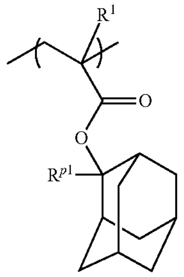

(1-2)

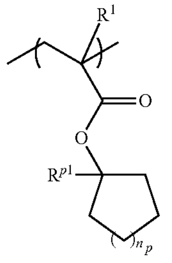

(1-3)

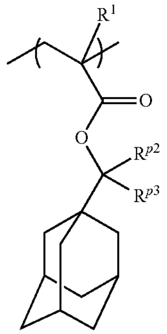

-continued
(1-4)
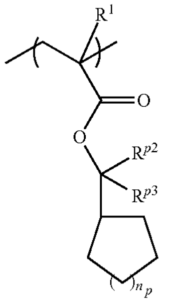
In the above formulae (1-1) to (1-4), $R^1$ is as defined in the above formula (1); $R^{p1}$, $R^{p2}$ and $R^{p3}$ are as defined in the above formula (i); and $n_p$ is an integer of 1 to 4.
The structural units represented by the above formula(e) (1) or (1-1) to (1-4) are exemplified by structural units represented by the following formulae, and the like.
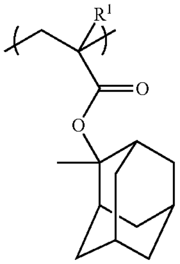
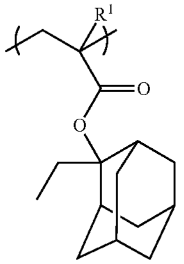
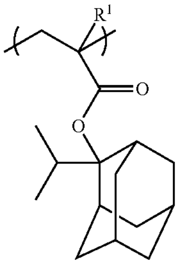
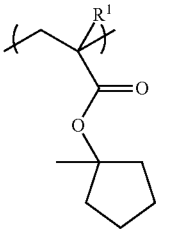
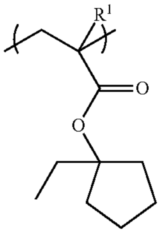
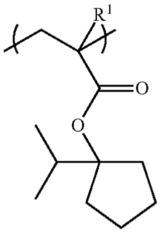
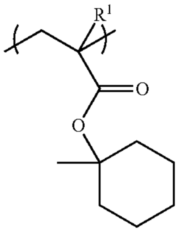
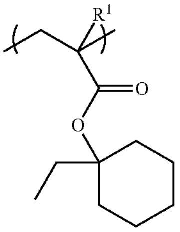
-continued
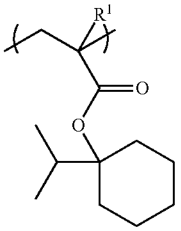
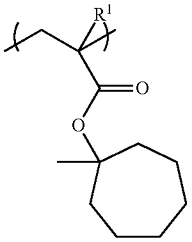
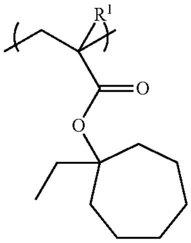
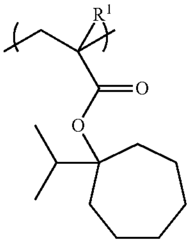
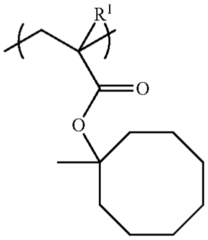
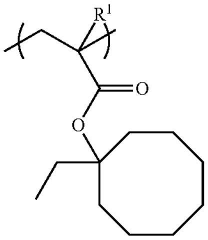
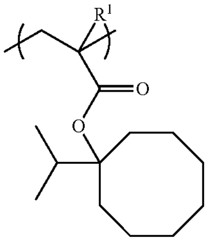
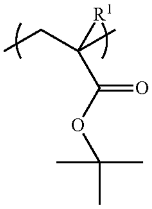
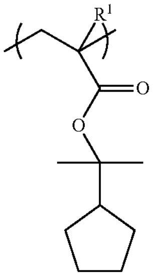
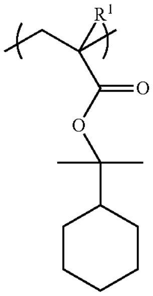
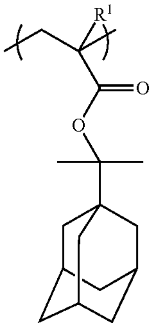
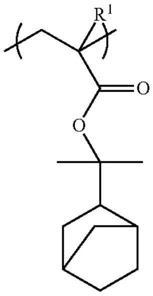

-continued

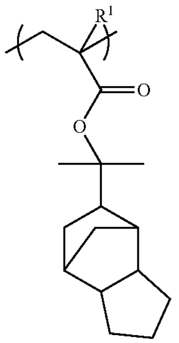

In the above formulae, $R^1$ is as defined in the above formula (1).

Examples of a monomer that gives the structural unit (I) include a (meth)acrylic acid 2-methyladamantyl-2-yl ester, a 2-ethyladamantyl (meth)acrylate-2-yl ester, a (meth)acrylic acid-2-methylbicyclo[2.2.1]hept-2-yl ester, a (meth)acrylic acid-2-ethylbicyclo[2.2.1]hept-2-yl ester, a (meth)acrylic acid 1-(bicyclo[2.2.1]hept-2-yl)-1-methylethyl ester, a (meth)acrylic acid 1-(adamantan-1-yl)-1-methylethyl ester, a (meth)acrylic acid 1-methyl-1-cyclopentyl ester, a (meth) acrylic acid 1-ethyl-1-cyclopentyl ester, a (meth)acrylic acid 1-methyl-1-cyclohexyl ester, a (meth)acrylic acid 1-ethyl-1-cyclohexyl ester, and the like.

The lower limit of the proportion of the structural unit (I) contained with respect to the total structural units constituting the polymer (a) is preferably 30 mol %, and more preferably 35 mol %. The upper limit of the proportion is preferably 70 mol %, and more preferably 65 mol %. When the proportion of the structural unit (I) falls within the above range, a resist pattern having a still more favorable shape can be formed according to the pattern-forming method.

The polymer (a) preferably has a structural unit (II) that includes at least one selected from the group consisting of a lactone structure, a cyclic carbonate structure and a sultone structure, may have a structural unit (III) that includes a hydrophilic functional group, and may also have other structural unit than the structural units described above.

Structural Unit (II)

The structural unit (II) includes at least one selected from the group consisting of a lactone structure, a cyclic carbonate structure and a sultone structure. When the polymer (a) has the structural unit (II), the adhesiveness between the prepattern and a substrate is improved, and consequently a pattern having a more favorable shape can be formed according to the pattern-forming method. The structural unit (II) is exemplified by structural units represented by the following formulae, and the like.

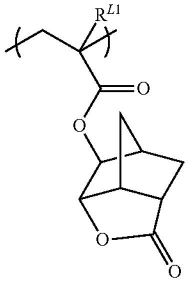

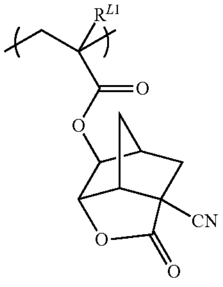

-continued

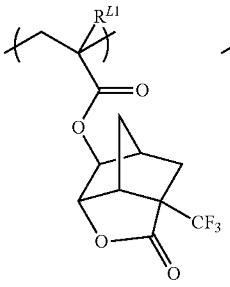

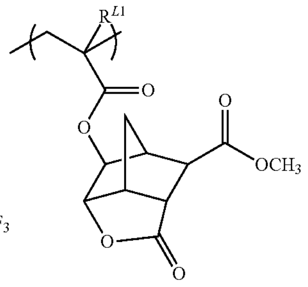

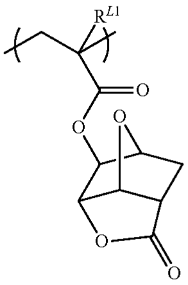

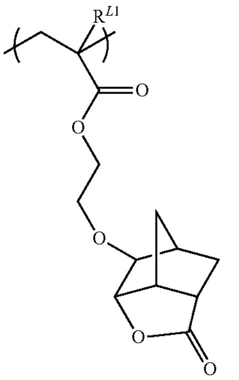

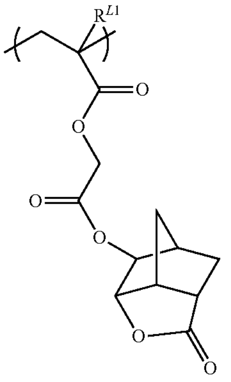

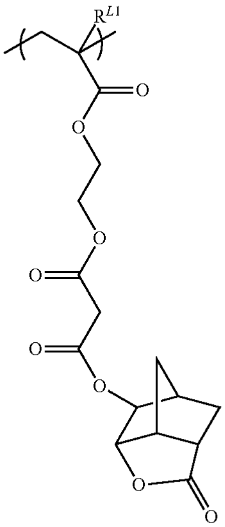

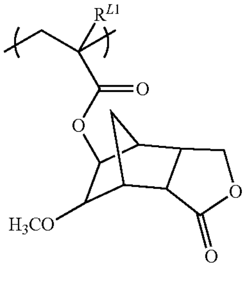

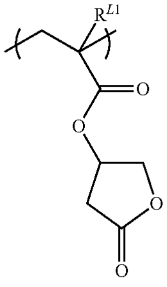

-continued
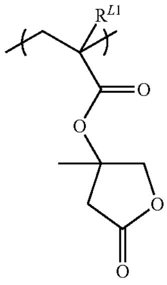
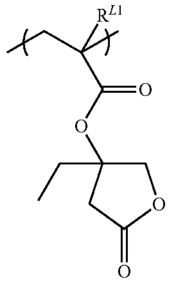
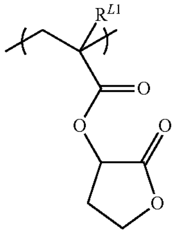
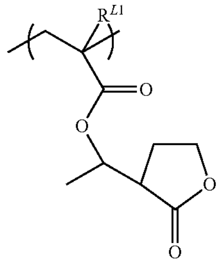
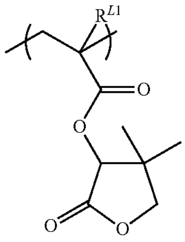
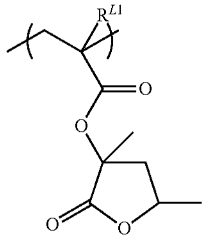
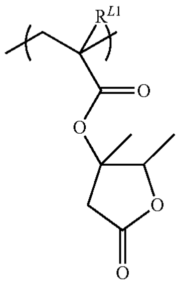
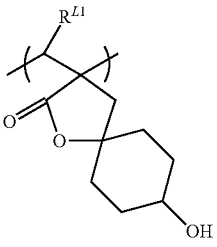
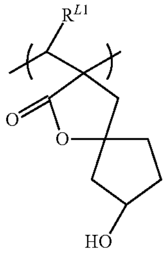
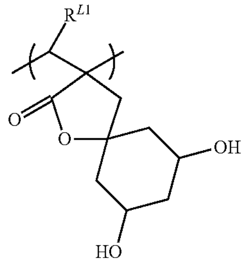
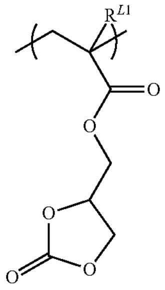
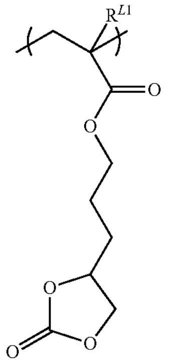
-continued
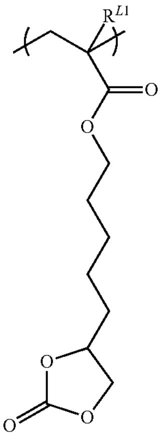
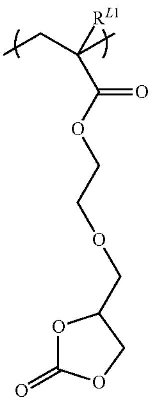
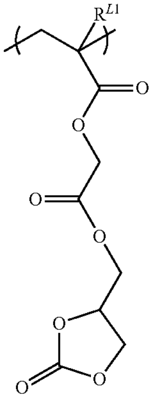
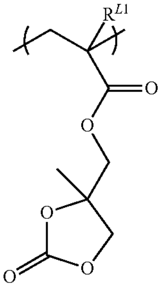
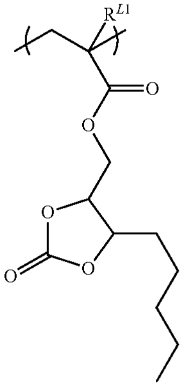
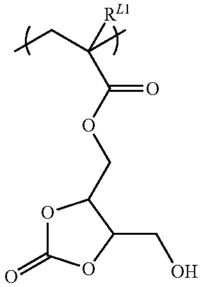
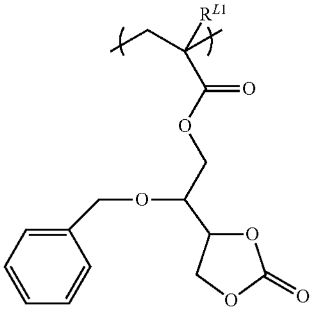

-continued

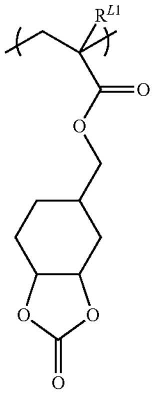

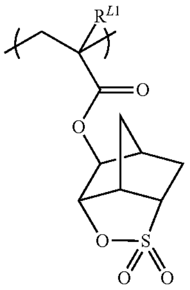

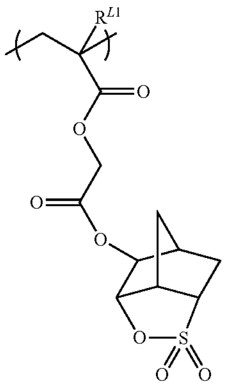

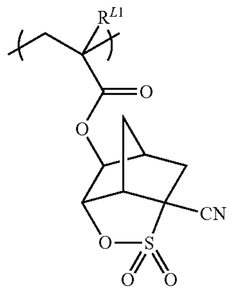

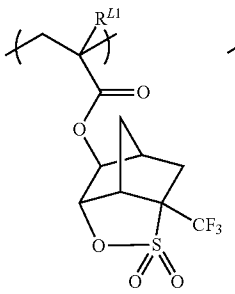

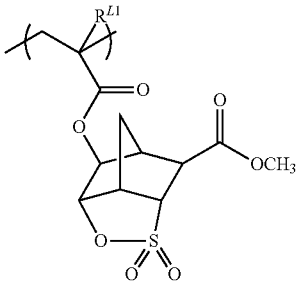

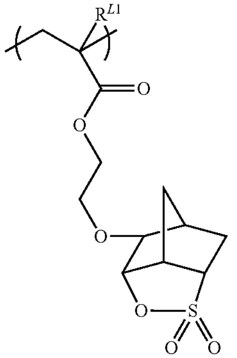

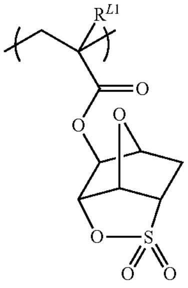

-continued

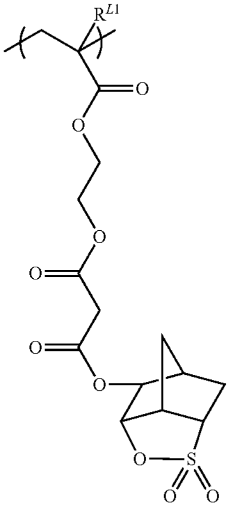

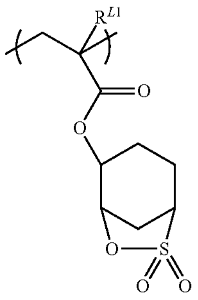

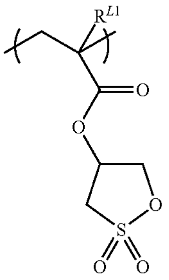

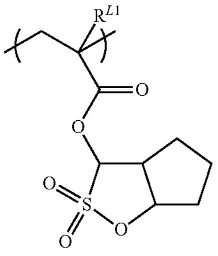

In the above formulae, $R^{L1}$ represents a hydrogen atom, a fluorine atom, a methyl group or a trifluoromethyl group.

The lower limit of the proportion of the structural unit (II) contained with respect to the total structural units constituting the polymer (a) is preferably 30 mol %, and more preferably 35 mol %. The upper limit of the proportion is preferably 70 mol %, and more preferably 65 mol %. When the proportion of the structural unit (II) falls within the above range, the pattern-forming method enables a pattern having a still more favorable shape to be formed.

Structural Unit (III)

The structural unit (III) has a hydrophilic functional group. When the polymer (a) has the structural unit (III), the adhesiveness between the prepattern and a substrate is improved, and consequently, a pattern having a more favorable shape can be formed according to the pattern-forming method.

Examples of the hydrophilic functional group include a hydroxy group, a carboxy group, an amino group, an oxo group (═O), a sulfonamide group, a cyano group, a nitro group, and the like. Of these, the hydroxy group is preferred.

The structural unit (III) is exemplified by structural units represented by the following formulae, and the like.

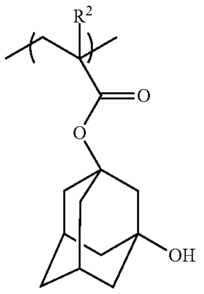
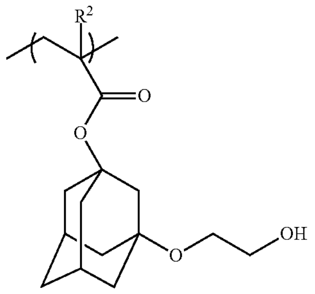
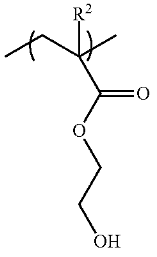
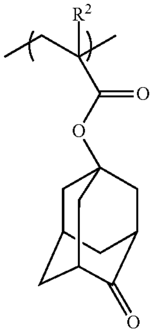
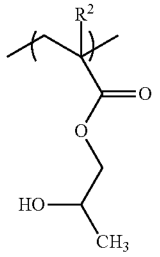
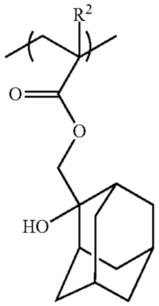
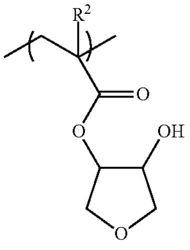
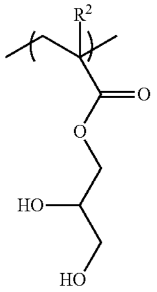
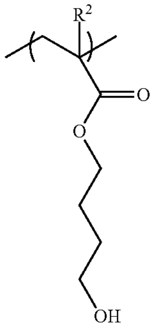
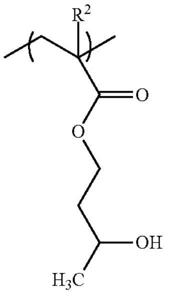
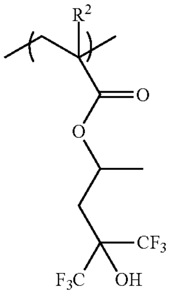
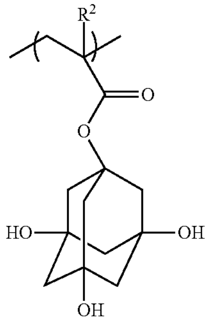
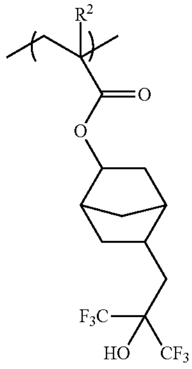

-continued

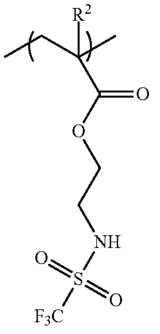
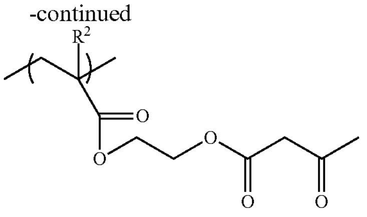

In the above formulae, $R^2$ represents a hydrogen atom, a fluorine atom, a methyl group or a trifluoromethyl group.

The proportion of the structural unit (III) contained with respect to the total structural units constituting the polymer (a) is preferably no less than 0 mol % and no greater than 40 mol %, and more preferably no less than 0 mol % and no greater than 30 mol %. When the proportion of the structural unit (III) falls within the above range, a resist pattern having a still more favorable shape can be formed according to the pattern-forming method.

The polymer (a) may also have other structural unit than the structural units described above. The other structural unit is exemplified by a structural unit that includes an acid-nonlabile alicyclic hydrocarbon group, and the like. The proportion of the other structural unit contained with respect to the total structural units constituting the polymer (a) is preferably no less than 0 mol % and no greater than 30 mol %, and more preferably no less than 0 mol % and no greater than 20 mol %.

The content of the polymer (a) in the total solid content of the resist composition is preferably no less than 70% by mass, more preferably no less than 80% by mass, and still more preferably no less than 85% by mass.

Synthesis Method of Polymer (a)

The polymer (a) may be synthesized by, for example, polymerizing monomers that give each structural unit in an appropriate solvent using a radical polymerization initiator.

Examples of the radical polymerization initiator include: azo radical initiators such as 2,2'-azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile) and dimethyl 2,2'-azobisisobutyrate; peroxide radical initiators such as benzoyl peroxide, t-butyl hydroperoxide and cumene hydroperoxide; and the like. Of these, AIBN and dimethyl 2,2'-azobisisobutyrate are preferred. These radical initiators may be used as a mixture of two or more types thereof.

Examples of the solvent used in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

halogenated hydrocarbons such as chlorobutanes, bromohexanes, dichloroethanes, hexamethylene dibromide and chlorobenzene;

saturated carboxylic acid esters such as ethyl acetate, n-butyl acetate, i-butyl acetate and methyl propionate;

ketones such as acetone, methyl ethyl ketone, 4-methyl-2-pentanone and 2-heptanone;

ethers such as tetrahydrofuran, dimethoxyethanes and diethoxyethanes;

alcohols such as methanol, ethanol, 1-propanol, 2-propanol and 4-methyl-2-pentanol; and the like. These solvents may be used either alone, or two or more types thereof may be used in combination.

The reaction temperature in the polymerization is typically no less than 40° C., and preferably no less than 50° C., whereas the reaction temperature is typically no greater than 150° C., and preferably no greater than 120° C. The reaction time period is typically no less than 1 hour, whereas the reaction time period is typically no greater than 48 hrs, and preferably no greater than 24 hrs.

The weight average molecular weight (Mw) of the polymer (a) as determined by gel permeation chromatography (GPC) is preferably no less than 1,000. Whereas, the weight average molecular weight (Mw) is preferably no greater than 100,000, more preferably no greater than 50,000, and particularly preferably no greater than 30,000. When the Mw of the polymer (a) falls within the above range, a pattern having a still more favorable shape can be formed according to the pattern-forming method.

The ratio (Mw/Mn) of the Mw to the number average molecular weight (Mn) of the polymer (a) is typically no less than 1 and no greater than 3, and preferably no less than 1 and no greater than 2.

The Mw and the Mn of the polymer are determined GPC using GPC columns available from Tosoh Corporation ("02000 HXL"×2, "G3000 HXL"×1, and "G4000 HXL"×1), under the following conditions.

eluent: tetrahydrofuran (available from Wako Pure Chemical Industries, Ltd.);

flow rate: 1.0 mL/min;

sample concentration: 1.0% by mass;

amount of injected sample: 100 μL;

detector: differential refractometer; and standard substance: mono-dispersed polystyrene (b) Acid Generator The acid generator (b) is a substance that generates an acid upon an exposure. The polymer (a) has a solubility in an organic solvent to be decreased by the action of the acid generated from the acid generator (b) through e.g., a dissociation of the acid-labile group. As a result, a prepattern that is insoluble or hardly soluble in the organic solvent can be formed. In addition, the prepattern may contain an acid generated upon the exposure from the acid generator (b). As a result, a resist pattern having a fine and favorable shape can be more effectively formed according to the pattern-forming method. The acid generator (b) may be contained in the resist composition in the form of a low molecular weight compound as described later (hereinafter, may be also referred to as "(b) acid generating agent" or "acid generating agent (b)", as appropriate), in the form incorporated into the polymer, or in both of these forms.

The acid generating agent (b) is exemplified by onium salt compounds, N-sulfonyloxyimide compounds, and the like.

Examples of the onium salt compounds include sulfonium salts, tetrahydrothiophenium salts, iodonium salts, and the like.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium 2-bicyclo[2.2.1]hept-2-yl-1,1-difluoroethanesulfonate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylsulfonium 1,1,2,2-tetrafluoro-6-(1-adamantanecarbonyloxy)-hexane-1-sulfonate, triphenylsulfonium 2-(1-adamantyl)-1,1-difluoroethanesulfonate, and the like.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl) tetrahydrothiophenium 2-bicyclo[2.2.1]hept-2-yl-1,1,2,2-tetrafluoroethanesulfonate, 1-(4-n-butoxynaphthalen-1-yl) tetrahydrothiophenium camphorsulfonate, 1-(6-n-butoxynaphthalen-2-yl)tetrahydrothiophenium trifluoromethanesulfonate, 1-(6-n-butoxynaphthalen-2-yl) tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl) tetrahydrothiophenium 2-bicyclo[2.2.1]hept-2-yl-1,1,2,2-tetrafluoroethanesulfonate, 1-(6-n-butoxynaphthalen-2-yl) tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium camphorsulfonate, and the like.

Examples of the iodonium salt include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium camphorsulfonate, and the like.

Examples of the N-sulfonyloxyimide compound include N-(trifluoromethanesulfonyloxy)bicyclo[2.2.1]hept-5-ene-2,3-dicarboxyimide, N-(nonafluoro-n-butanesulfonyloxy) bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, N-(2-(3-tetracyclo[4.4.0.$1^{2,5}$.$1^{7,10}$] dodecanyl)-1,1-difluoroethanesulfonyloxy)bicyclo[2.2.1] hept-5-ene-2,3-dicarboxylmide, N-(camphorsulfonyloxy) bicyclo[2.2.1]hept-5-ene-2,3-dicarboxyimide, and the like.

The acid generating agent (b) is preferably the onium salt compound, and more preferably the sulfonium salt. The acid generating agent (b) may be used either one or two or more types thereof.

The content of the acid generator (b) with respect to 100 parts by mass of the polymer (a) is, in a case where the acid generator (b) is the acid generating agent (b), typically no less than 0.1 parts by mass, and preferably no less than 0.5 parts by mass. Whereas, the content is typically no greater than 20 parts by mass, and preferably no greater than 15 parts by mass. When the content of the acid generating agent (b) is less than the lower limit, the sensitivity and developability of the resist composition may be deteriorated. On the other hand, when the content of the acid generating agent (b) is greater than the upper limit, transparency to the radioactive rays are impaired, whereby a desired resist pattern may be hardly obtained.

(c) Solvent

Any solvent may be used as the solvent (c) without being particularly limited as long as the polymer (a), the acid generator (b) and the other component can be dissolved or dispersed therein. The solvent (c) is exemplified by similar solvents to those exemplified as the organic solvent for use in the prepattern-forming step, and the like.

Of these, the solvent (c) is preferably the ester solvent and the ketone solvent. As the ester solvent, the polyhydric alcohol mono ether acetate solvents and lactone solvents are preferred, and propylene glycol monomethyl ether acetate and γ-butyrolactone are more preferred. As the ketone solvent, cyclic ketone solvents are preferred, and cyclohexanone is more preferred.

(d) Polymer

The polymer (d) has a greater percentage content of fluorine atoms than that of the polymer (a). In a case where the resist composition contains the polymer (d), when a resist film is formed, oil repellent characteristics of the polymer (d) tend to allow the polymer (d) to be localized in the surface region of the resist film. As a result, when liquid immersion lithography is carried out, it is preferred in that elution of the acid generating agent, the acid diffusion control agent and the like into the liquid immersion medium may be inhibited. In addition, due to water repellent characteristics of the polymer (d), an advancing contact angle of a liquid immersion medium on the resist film can be controlled to fall within a desired range, whereby generation of bubble defects can be inhibited. Further, a greater receding contact angle of the liquid immersion medium on the resist film is attained, whereby an exposure by high speed scanning without being accompanied by residual water beads is enabled. It is to be noted that the percentage content (% by mass) of fluorine atoms may be calculated based on the structure of the polymer determined by $^{13}$C-NMR, $^{1}$H-NMR, IR spectrum and the like.

The polymer (d) is not particularly limited as long as the percentage content of fluorine atoms thereof is greater than that of the polymer (a), and preferably has a fluorinated alkyl group. The polymer (d) is prepared by polymerizing at least one or more types of monomers that include a fluorine atom in the structure thereof. The monomers that include a fluorine atom in the structure thereof are exemplified by a monomer that includes a fluorine atom in its main chain, a monomer that includes a fluorine atom in its side chain, and a monomer that includes a fluorine atom in its main chain and side chain.

Examples of the monomer that includes a fluorine atom in its main chain include α-fluoroacrylate compounds, α-trifluoromethyl acrylate compounds, β-fluoroacrylate compounds, β-trifluoromethylacrylate compounds, α,β-fluoroacrylate compounds, α,β-trifluoromethylacrylate compounds, compounds derived by substituting a hydrogen atom of one or more types of vinyl moieties by a fluorine atom, a trifluoromethyl group, etc., and the like.

Examples of the monomer that includes a fluorine atom in its side chain include: compounds in which an alicyclic olefin compound such as norbornene has a fluorine atom, or a fluoroalkyl group or a derivative thereof as a side chain; ester compounds of acrylic acid or methacrylic acid with a fluoroalkyl group or a derivative thereof; monomers in which olefins having a fluorine atom, or a fluoroalkyl group or a derivative thereof as one or more types of side chain (a site excluding a double bond), and the like.

Example of the monomer that includes a fluorine atom in its main chain and side chain include: ester compounds of α-fluoroacrylic acid, β-fluoroacrylic acid, α,β-fluoroacrylic acid, α-trifluoromethylacrylic acid, β-trifluoromethylacrylic acid, α,β-trifluoromethylacrylic acid or the like with a fluoroalkyl group or a derivative thereof; monomers derived by substituting hydrogen atom(s) of one or more types of vinyl moieties by a fluorine atom or a trifluoromethyl group and substituting a side chain of the compound with a fluorine atom, or a fluoroalkyl group or a derivative thereof; monomers in which alicyclic olefin compounds derived by substituting hydrogen atom(s) bonded to one or more types of double bonds by a fluorine atom or a trifluoromethyl group, etc., and having a fluorinated alkyl group or a derivative thereof as a side chain; and the like. The alicyclic olefin compound as referred to herein means a compound that includes a double bond in a part of its ring.

It is preferred that the polymer (d) includes the fluorine atom by having a structural unit (IV) represented by the following formula (F1).

(F1)

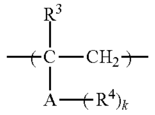

In the above formula (F1), $R^3$ represents a hydrogen atom, a fluorine atom, a methyl group or a trifluoromethyl group; $R^4$ represents a linear or branched alkyl group having 1 to 6 carbon atoms and having at least one fluorine atoms, or a monovalent alicyclic hydrocarbon group having 4 to 20 carbon atoms and having at least one fluorine atoms, or a derivative group thereof; k is an integer of 1 to 3, wherein in a case where $R^4$ is present in a plurality of number, a plurality of $R^4$s may be identical or different; and A represents a single bond or a linking group having a valency of (k+1).

Examples of the linking group having a valency of (k+1) which may be represented by A include an oxygen atom, a sulfur atom, a carbonyloxy group, an oxycarbonyl group, an amide group, a sulfonylamide group, a urethane group, a carbonyloxy-di(oxycarbonyl)ethanediyl group, a carbonyloxy-di(oxycarbonyl)propanediyl group, a tri(carbonyloxy)ethanediyl group, a carbonyloxy-tri(oxycarbonyl)ethanediyl group, a carbonyloxy-tri(oxycarbonyl)propanediyl group, a tetra(carbonyloxy)ethanediyl group, and the like.

Examples of preferred monomers that give the structural unit (IV) include (meth)acrylic acid trifluoromethyl ester, (meth)acrylic acid 2,2,2-trifluoroethyl ester, (meth)acrylic acid perfluoroethyl ester, (meth)acrylic acid perfluoro-n- propyl ester, (meth)acrylic acid perfluoro-i-propyl ester, (meth)acrylic acid perfluoro-n-butyl ester, (meth)acrylic acid perfluoro-i-butyl ester, (meth)acrylic acid perfluoro-t-butyl ester, (meth)acrylic acid 2-(1,1,1,3,3,3-hexafluoropropyl) ester, (meth)acrylic acid 1-(2,2,3,3,4,4,5,5-octafluoropentyl) ester, (meth)acrylic acid perfluorocyclohexylmethyl ester, (meth)acrylic acid 1-(2,2,3,3,3-pentafluoropropyl) ester, (meth)acrylic acid 1-(3,3,4,4,5,5,6,6,7,7,8,8,9,9,10,10,10-heptadecafluorodecyl) ester, (meth)acrylic acid 1-(5-trifluoromethyl-3,3,4,4,5,6,6,6-octafluorohexyl) ester and (meth)acrylic acid 2,2-di(2,2,2-trifluoroethyloxycarbonyl) ethyl ester, and the (meth)acrylic acid 2,2,2-trifluoroethyl ester and the (meth)acrylic acid 2,2-di(2,2,2-trifluoroethyloxycarbonyl)ethyl ester are more preferred.

The polymer (d) may have two or more types of the structural unit (IV). The proportion of the structural unit (IV) contained with respect to the total structural units in the polymer (d) is typically no less than 5 mol %, preferably no less than 10 mol %, and more preferably no less than 15 mol %. When the proportion of the structural unit (IV) is less than 5 mol %, the receding contact angle of no less than 70° may not be achieved, and/or elution of the acid generating agent and the like from the resist coating film may not be inhibited.

In addition to the structural unit (IV), in order to control rates of dissolution in developer solutions, the polymer (d) may have at least one type of other structural units such as, for example: the structural unit (I) in the polymer (a) that includes an acid-labile group; the structural unit (II) in the polymer (a) that includes at least one selected from the group consisting of a lactone structure, a cyclic carbonate structure and a sultone structure; and a structural unit that includes an alicyclic hydrocarbon group.

The structural unit that includes an alicyclic hydrocarbon group is exemplified by a structural unit represented by the following formula (F2), and the like.

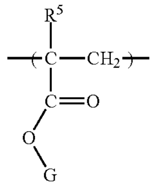

(F2)

In the above formula (F2), $R^5$ represents a hydrogen atom, a fluorine atom, a methyl group or a trifluoromethyl group; and G represents a monovalent alicyclic hydrocarbon group having 4 to 20 carbon atoms.

The monovalent alicyclic hydrocarbon group having 4 to 20 carbon atoms represented by G is exemplified by hydrocarbon groups having an alicyclic ring derived from a cycloalkane such as cyclobutane, cyclopentane, cyclohexane, bicyclo[2.2.1]heptane, bicyclo[2.2.2]octane, tricyclo[5.2.1.$0^{2,6}$]decane, tetracyclo[6.2.1.$1^{3,6}$.$0^{2,7}$]dodecane or tricyclo[3.3.1.$1^{3,7}$]decane.

The proportion of the other structural unit contained with respect to the total structural units constituting the polymer (d) is typically no greater than 90 mol %, and preferably no greater than 80 mol %.

The content of the polymer (d) with respect to 100 parts by mass of the polymer (a) is preferably no less than 0.1 parts by mass, and more preferably no less than 1 part by mass. On the other hand, the content is preferably no greater than 20 parts by mass, and more preferably no greater than 10 parts by mass. When the content of the polymer (d) falls within the above range, water repellency of the surface of the formed resist film can be more appropriately increased.

Synthesis Method of Polymer (d)

With respect to the synthesis method of the polymer (d), for example, a similar method to the synthesis method of the polymer (a) may be employed to enable the polymer (d) to be synthesized. The Mw of the polymer (d) is preferably no less than 1,000, whereas the Mw is preferably no greater than 50,000, more preferably no greater than 30,000, and still more preferably no greater than 10,000. When the Mw of the polymer (d) is less than 1,000, a satisfactory advancing contact angle may not be obtained.

(e) Acid Diffusion Controller

The acid diffusion controller (e) achieves the effect of controlling a diffusion phenomenon of the acid, etc., generated from the acid generator (b) upon an exposure in the resist film, and inhibiting unfavorable chemical reactions at light-unexposed regions. In addition, the acid diffusion controller (e) also achieves the effect of improving the storage stability of the resist composition containing the same. The acid diffusion controller (e) may be contained in the resist composition in the form of a free compound (hereinafter, may be also referred to as "(e) acid diffusion control agent" or "acid diffusion control agent (e)", as appropriate), or in the form incorporated as a part of the polymer, or in both of these forms.

The acid diffusion control agent (e) is exemplified by an amine compound, an amide group-containing compound, a urea compound, a nitrogen-containing heterocyclic compound, and the like.

Examples of the amine compound include mono (cyclo) alkylamines; di(cyclo)alkylamines; tri(cyclo)alkylamines; substituted alkylanilines and derivatives thereof; ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis(1-(4-aminophenyl)-1-methylethyl)benzene, 1,3-bis(1-(4-aminophenyl)-1-methylethyl)benzene, bis(2-dimethylaminoethyl) ether, bis(2-diethylaminoethyl) ether, 1-(2-hydroxyethyl)-2-imidazolidinone, N,N,N',N'-tetrakis(2-hydroxypropyl) ethylenediamine, N,N,N',N",N"-pentamethyldiethylenetriamine, and the like.

Examples of the amide group-containing compound include N-t-butoxycarbonyl group-containing amino compounds such as N-(t-butoxycarbonyl)-4-hydroxypiperidine N-t-pentyloxycarbonyl group-containing amino compounds such as N-(t-pentyloxycarbonyl)-4-hydroxypiperidineformamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like.

Examples of the urea compound include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compound include imidazoles; pyridines; piperazines; pyrazine, pyrazole, pyridazine, quinoxaline, purine, pyrrolidine, piperidine, piperidineethanol, 2-quinoxalinol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

A photolabile base which is sensitized upon an exposure to generate a weak acid may be used as the acid diffusion control agent (e). The photolabile base is exemplified by an onium salt compound that loses acid diffusion controllability through degradation upon an exposure, and the like. The onium salt compound is exemplified by a sulfonium salt compound represented by the following formula (K1), an iodonium salt compound represented by the following formula (K2), and the like.

(K1)

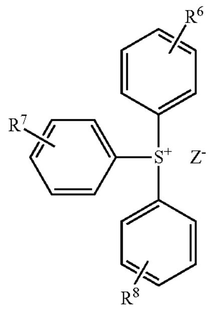

(K2)

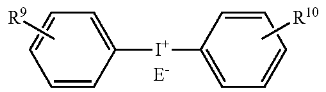

In the above formulae (K1) and (K2), $R^6$ to $R^{10}$ each independently represent a hydrogen atom, an alkyl group, an alkoxy group, a hydroxyl group or a halogen atom; and $Z^-$ and $E^-$ represent $OH^-$, $R^A$—$COO^-$, $R^A$—$SO_3^-$, $R^A$—$N^-$—$SO_2$—$R^B$ or an anion represented by the following formula (K3), wherein $R^A$ represents an alkyl group, an aryl group or an alkaryl group; and $R^B$ represents an alkyl group which may have a fluorine atom.

(K3)

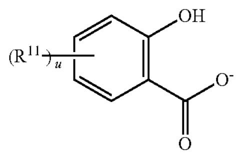

In the above formula (K3), $R^{11}$ represents a linear or branched alkyl group having 1 to 12 carbon atoms, or a linear or branched alkoxyl group having 1 to 12 carbon atoms, wherein a part or all of hydrogen atoms included in the linear or branched alkyl group or the linear or branched alkoxyl group may be substituted with a fluorine atom; and u is an integer of 0 to 2.

Other Components

In addition to the components (a) to (e) described above, the resist composition may contain other component. The other component is exemplified by a surfactant, a sensitizing agent and the like.

Surfactant

The surfactant achieves the effect of improving the application property, striation, developability, and the like. As the surfactant, any surfactant similar to those used in general resist compositions may be used.

Sensitizing Agent

The sensitizing agent exhibits the action of increasing the amount of the acid generated from the acid generator (b) or the like, and achieves the effect of improving "apparent sensitivity" of the resist composition.

Examples of the sensitizing agent include carbazoles, acetophenones, benzophenones, naphthalenes, phenols, biacetyl, eosin, rose bengal, pyrenes, anthracenes, phenothiazines, and the like. These sensitizing agents may be used in combination of two or more types thereof.

Preparation Method of Resist Composition

The resist composition may be prepared, for example, by mixing the polymer (a), the acid generator (b), the solvent (c) and favorable component(s) in a certain ratio. The total solid content concentration of the resist composition is typically no less than 1% by mass and no greater than 50% by mass, and preferably no less than 1% by mass and no greater than 25% by mass.

As an alternative to the prepattern-forming step described above, this step may be carried out by the steps of, for example: forming a resist film from the aforementioned resist composition; exposing the resist film; thereafter developing the exposed resist film with an alkaline developer solution such as an aqueous tetramethylammonium hydroxide solution; and subjecting thus developed resist film to an overall-exposure.

Contacting Step

In this step, at least lateral faces of the prepattern are brought into contact with the composition (II) which contains the basic compound and the organic solvent and which does not contain the polymer having a solubility in the organic solvent to be decreased by the action of the acid. When this contacting step is included, the shape of the formed pattern can be more favorable according to the pattern-forming method. This advantage is presumed to result from, for example, adhesion of the basic compound to the prepattern by bringing the composition (II) into contact with the at least lateral faces of the prepattern, followed by formation of regions including anionic groups such as a carboxylate group in adjacent regions formed in subsequent resin layer-forming step and insolubilizing or desolubilizing step, wherein the anionic groups are derived from the acidic groups such as the carboxy group constituting the adjacent regions, due to the basic compound, thereby leading to an increase of the extent of the desolubilization of the adjacent regions in the organic solvent used in the removing step.

The basic compound contained in the composition (II) is not particularly limited as long as it is basic, and is exemplified by compounds similar to those exemplified as (q) a basic compound contained in a composition (I-B) described later, and the like.

The organic solvent contained in the composition (II) is exemplified by organic solvents similar to those exemplified in connection with the prepattern-forming step, and the like.

The polymer, which is not contained in the composition (II), having a solubility in the organic solvent to be decreased by the action of the acid is exemplified by polymers similar to those exemplified as the polymer (a) involved in the prepattern-forming step, and the like.

The composition (II) may contain other component(s) in addition to the basic compound and the organic solvent, and for example, a surfactant and the like may be contained.

The lower limit of the content of the basic compound in the composition (II) is preferably 0.01% by mass, more preferably 0.05% by mass, still more preferably 0.1% by mass, and particularly preferably 0.2% by mass. The upper limit of the content is preferably 10% by mass, more preferably 5% by mass, still more preferably 1% by mass, and particularly preferably 0.5% by mass.

The procedure for bringing the composition (II) into contact with the at least lateral faces of the prepattern is exemplified by spin coating and the like.

Resin Layer-Forming Step

In this step, a resin layer is formed on at least lateral faces of the prepattern. This resin layer contains the polymer (1) and is formed from the composition (I), and involves at least one selected from the following features (i) and (ii):

(i) the polymer (I) having a basic group; and (ii) the composition (I) further containing a basic compound.

Figure 1B:
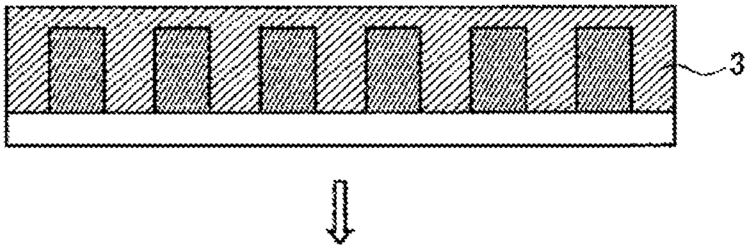

According to this step, a resin layer 3 is formed on at least lateral faces of the prepattern 2 as shown in FIG. 1B. The composition (I) may be either a composition (I-A) involving the feature (i), or a composition (I-B) involving the feature (ii). According to the pattern-forming method, a pattern having a fine and favorable shape can be formed substantially irrespective of the pattern type by using the composition (I). This advantage is presumed to result from, for example, conversion of the acidic groups such as the carboxy group of the polymer in adjacent regions formed in the insolubilizing or desolubilizing step, wherein the polymer constitutes the adjacent regions, into anionic groups such as a carboxylate group, due to the basicity of the composition (I) involving the feature (i) or (ii), thereby making the adjacent regions more hardly soluble in the organic solvent used in the removing step.

The polymer (I), the composition (I-A) and the composition (I-B) will follow in this order.

Polymer (I)

The polymer (I) has a solubility in the organic solvent to be decreased by an action of an acid. The polymer (I) is not particularly limited as long as the above property is exhibited, and is exemplified by examples of the polymer (a) in connection with the prepattern-forming step, and the like.

It is preferred that the polymer (I) has an acid-labile group such that the solubility in the organic solvent can be more effectively decreased by an action of an acid (hereinafter, the polymer having an acid-labile group may be also referred to as "polymer (I')"). The structural unit that includes an acid-labile group (hereinafter, may be also referred to as "structural unit (A)") is exemplified by the structural unit (I) of the polymer (a') contained in the resist composition, and the like. The structural unit (A) may or may not include an aromatic ring.

The lower limit of the proportion of the structural unit (A) contained with respect to the total structural units constituting the polymer (I) is preferably 10 mol %, more preferably 30 mol %, and still more preferably 40 mol %. The upper limit of the proportion is preferably 80 mol %, more preferably 70 mol %, and still more preferably 60 mol %.

The polymer (I) preferably has a structural unit (hereinafter, may be also referred to as "structural unit (B)") that includes an aromatic ring having 6 to 30 carbon atoms. When the polymer (I) has the structural unit (B), a pattern that is superior in etching resistance can be formed according to the pattern-forming method.

Examples of the aromatic ring having 6 to 30 carbon atoms include a benzene ring, a naphthalene ring, an anthracene ring, a phenanthrene ring, a pyrene ring, a chrysene ring, a tetracene ring, a pentacene ring and the like. Of these, in light of possible formation of a pattern having a more fine and favorable shape, the aromatic ring having 6 to 15 carbon atoms is preferred, and the benzene ring and the naphthalene ring are more preferred.

In addition to a linking group between the aromatic ring and the main chain of the polymer (1), a substituent that substitutes for hydrogen atom(s) on the ring may be bonded to the aromatic ring.

Examples of the substituent include:

hydrocarbon groups such as a chain hydrocarbon group, an alicyclic hydrocarbon group and an aromatic hydrocarbon group;

halogen atoms such as a fluorine atom, a chlorine atom, a bromine atom and an iodine atom;

a hydroxy group, an amino group, sulfanyl group, a nitro group and a cyano group;

oxyhydrocarbon groups such as an alkoxy group, a cycloalkyloxy group and an aryloxy group;

acyl groups such as an alkylcarbonyl group, a cycloalkylcarbonyl group and an arylcarbonyl group;

carbonyloxyhydrocarbon groups such as an alkoxycarbonyloxy group, a cycloalkyloxycarbonyloxy group and an aryloxycarbonyloxy group;

sulfonylhydrocarbon groups such as an alkylsulfonyl group, a cycloalkylsulfonyl group and an arylsulfonyl group; and the like.

Examples of the monomer that gives a structural unit (B) include:

vinylaromatic hydrocarbons such as styrene, vinylnaphthalene and vinylanthracene, and substituted forms of the same;

aryl (meth)acrylate esters such as a phenyl (meth)acrylate ester, a naphthyl (meth)acrylate ester and an anthryl (meth) acrylate ester, and substituted forms of the same;

acenaphthylene and substituted forms thereof; and the like.

The lower limit of the proportion of the structural unit (B) contained with respect to the total structural units constituting the polymer (I-A) is 20 mol %, preferably 25 mol %, more preferably 30 mol %, still more preferably 40 mol %, and particularly preferably 50 mol %. The upper limit of the proportion is preferably 100 mol %, more preferably 80 mol %, still more preferably 70 mol %, and particularly preferably 60 mol %. When the proportion of the structural unit (B) falls within the above range, favorable shape of the resist pattern and etching resistance can be both attained at a higher level.

The polymer (I) may have any of various groups other than the aromatic ring and the acid-labile group. In light of an adjustment of dissolution and insolubilization of the resin layer formed by the pattern-forming method, it is preferred that the polymer (I) further has at least one selected from the set consisting of a hydroxy group, a carboxy group, an oxo group, a group having a lactone structure, a group having a cyclic carbonate structure, and a group having a sultone structure. These groups may be included in the structural unit (A) or the structural unit (B), or may be included in other structural unit except for the structural unit (A) and the structural unit (B).

The lower limit of the Mw of the polymer (I) is preferably 13,000, more preferably 15,000, still more preferably 17,000, particularly preferably 20,000, and further particularly 23,000. The upper limit of the Mw of the polymer (I) is preferably 150,000, more preferably 100,000, still more preferably 80,000, particularly preferably 50,000, and further particularly preferably 30,000. When the Mw falls within the above range, a pattern having a finer and more favorable shape can be formed according to the pattern-forming method. When the Mw is less than 13,000, the shape of the pattern formed by the pattern-forming method may be deteriorated. Further, when the Mw is greater than 150,000, the preparation of the composition (I) may be difficult.

Composition (I-A)

The composition (I-A) contains a polymer (I) having a basic group and having a solubility in the organic solvent to be decreased by an action of an acid (hereinafter, the polymer (I) may be also referred to as "polymer (I-A)"). The composition (I-A) preferably contains a solvent (i) in addition to the polymer (I-A), and may further contain other component such as e.g., acid incrementor. Each component will be described in the following.

Polymer (I-A)

The polymer (I-A) in (i) has a basic group and has a solubility in the organic solvent to be decreased by an action of an acid. In this polymer (I-A), a basic group is bonded to the polymer (I). The polymer (I-A) preferably has an acid-labile group and the basic group (hereinafter, the polymer (I-A) having such a feature may be also referred to as "polymer (I'-A)").

The basic group is not particularly limited as long as it has basicity, and is exemplified by a group represented by the following formula (a) (hereinafter, may be also referred to as "group (a)"), a group represented by the following formula (b) (hereinafter, may be also referred to as "group (b)"), and the like.

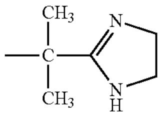

(a)

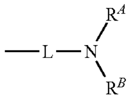

(b)

In the above formula (b), L represents a single bond, a divalent chain hydrocarbon group having 1 to 20 carbon atoms or a divalent alicyclic hydrocarbon group having 3 to 20 carbon atoms; and $R^A$ and $R^B$ each independently represent a hydrogen atom, a monovalent chain hydrocarbon group having 1 to 20 carbon atoms or a monovalent alicyclic hydrocarbon group having 3 to 20 carbon atoms, or L and $R^A$ may taken together represent an aliphatic heterocyclic structure having 3 to 20 ring atoms together with the nitrogen atom to which L and $R^A$ bond.

Examples of the divalent chain hydrocarbon group having 1 to 20 carbon atoms which may be represented by L include:

alkanediyl groups such as a methanediyl group, an ethanediyl group and a propanediyl group;

alkenediyl groups such as an ethenediyl group, a propenediyl group and a butenediyl group;

alkynediyl groups such as an ethynediyl group, a propenediyl group and a butynediyl group; and the like.

Examples of the divalent alicyclic hydrocarbon group having 3 to 20 carbon atoms which may be represented by L include:

cycloalkanediyl groups such as a cyclopropanediyl group, a cyclobutanediyl group, a cyclopentanediyl group, a cyclohexanediyl group, a cyclooctanediyl group, a cyclodecanediyl group, a norbornanediyl group and an adamantanediyl group;

cycloalkenediyl groups such as a cyclopropenediyl group, a cyclopentenediyl group, a cyclohexenediyl group and a norbornenediyl group; and the like.

The monovalent chain hydrocarbon group having 1 to 20 carbon atoms and the monovalent alicyclic hydrocarbon group having 3 to 20 carbon atoms which may be represented by $R^A$ and $R^B$ are exemplified by groups obtained by incorporating one hydrogen atom into those exemplified as the divalent group which may be represented by L, and the like. $R^A$ and $R^B$ preferably represent a hydrogen atom or a monovalent chain hydrocarbon group, more preferably a hydrogen atom or an alkyl group, and still more preferably a hydrogen atom or a methyl group.

The aliphatic heterocyclic structure having 3 to 20 ring atoms taken together represented by L and $R^A$ together with the nitrogen atom to which L and $R^A$ bond is exemplified by an azacyclopropane structure, an azacyclobutane structure, an azacyclopentane structure, an azacyclohexane structure, an azacyclooctane structure, an azanorbornane structure and the like.

Examples of the group (b) include an amino group, an aminomethyl group, a methylamino group, a methylamino methyl group, a dimethylamino group, a dimethylamino methyl group, a diethylamino group, a diethylaminopropyl group, a pyrrolidin-1-yl group, a pyrrolidin-1-ylmethyl group, a piperidin-1-yl group, a piperidin-1-ylethyl group and the like.

The position of binding of the group (a) and the group (b) on the polymer (I-A) is not particularly limited, and the group (a) and the group (b) may bond to any of the main chain, the side chain, the end of the chain of the polymer (I-A) and at least two of these. It is preferred that the group (a) bonds to the end of the polymer (I-A). When the group (a) bonds to the polymer (I-A), the effects by the pattern-forming method can be exerted while the amount of incorporation of the group (a) into the polymer (I-A) is decreased. In addition, the group (a) may be conveniently introduced to the end of the polymer (I-A) by permitting polymerization using a radical polymerization initiator having the group (a).

Solvent (i)

The composition (I-A) typically contains the solvent (i). The solvent (i) is exemplified by solvents similar to those exemplified as the organic solvent for use in the prepattern-forming step, and the like.

Other Components

Other component which may be contained in the composition (I-A) is exemplified by an acid incrementor, a surfactant and the like.

Acid Incrementor

The acid incrementor is a component that is stable in the absence of an acid, but is degraded in the presence of an acid due to a catalytic reaction of the acid to produce a protonic acid, and then the protonic acid can be incrementally produced as the degradation reaction is accelerated along with the increase in the amount of the protonic acid produced. When the acid incrementor is contained in the composition (I-A), a larger amount of acid can be produced in the insolubilizing or desolubilizing step described later as compared with, for example, the acid and the like diffused from the prepattern into the resin layer. As a result, the adjacent regions of the resin layer to the prepattern can be more effectively insolubilized or desolubilized. The acid incrementor may be contained in the form of a compound as described later (hereinafter, may be also referred to as "acid increment agent", as appropriate), in the form incorporated into the polymer as a part thereof, or n both of these forms.

With regard to the strength of the generated acid in order to cause the degradation of the acid incrementor by a catalytic action of the acid generated, the acid dissociation constant (pKa) is preferably no greater than 3, and more preferably no greater than 2. When a weak acid having a pKa of greater than 3 is generated, the degradation of the acid incrementor tends to be less likely to proceed. The generated acid is preferably an organic sulfonic acid, and more preferably methanesulfonic acid, ethanesulfonic acid, propanesulfonic acid, butanesulfonic acid, pentanesulfonic acid, hexanesulfonic acid, heptanesulfonic acid, octanesulfonic acid, cyclohexanesulfonic acid, camphorsulfonic acid, trifluoromethanesulfonic acid, 2,2,2-trifluoroethanesulfonic acid, benzenesulfonic acid, p-toluenesulfonic acid, p-bromobenzenesulfonic acid, p-nitrobenzenesulfonic acid, 2-thiophenesulfonic acid, 1-naphthalenesulfonic acid and 2-naphthalenesulfonic acid.

It is preferred that the acid incrementor is a compound in which a sulfonate group represented by the following formula (E) is bonded, directly or via a divalent organic group, to the carbon atom that is forming a carbocyclic skeleton.

$$—OSO_2—R^a \qquad (E)$$

In the above formula (E), $R^a$ represents a monovalent organic group.

The monovalent organic group represented by $R^a$ is exemplified by a chain organic group, an organic group having an alicyclic structure, an organic group having an aromatic ring structure, an organic group having a heterocyclic structure, and the like.

The chain organic group is an organic group having carbon atoms of preferably 1 to 12, and more preferably 1 to 8. Examples of the chain organic group include: unsubstituted alkyl groups such as a methyl group, an ethyl group, a propyl group, a butyl group, a pentyl group and a hexyl group; unsubstituted acyl groups such as a formyl group, an acetyl group, a propionyl group and a butyryl group; unsubstituted alkenyl groups such as a vinyl group and an allyl group; unsubstituted alkenylcarbonyl groups such as a vinylcarbonyl group and an allyl carbonyl group; substituted forms of these groups; and the like.

Examples of the organic group having an alicyclic structure include: alicyclic hydrocarbon groups such as a cyclohexyl group, a cyclooctyl group, a bicyclohydrocarbon group and a tricyclohydrocarbon group; substituted forms of the same; and the like.

Examples of the organic group having an aromatic ring structure include aryl groups such as a phenyl group and a naphthyl group; aralkyl groups such as a benzyl group, a phenethyl group and a naphthylmethyl; substituted forms of the same; and the like.

Examples of the organic group having a heterocyclic structure include heterocyclic groups derived from a heterocyclic compound, and substituted forms of the same such as e.g.: 5-membered ring compound having one hetero atom such as furan, pyrrole, benzofuran, indole and carbazole, and condensed ring compounds of the same; 5-membered ring compound having two hetero atoms such as oxazole and pyrazole, and condensed ring compounds of the same; 6-membered ring compounds having one hetero atom such as pyran, pyrone, coumarin, pyridine, quinoline, isoquinoline and acridine, and condensed ring compounds of the same; 6-membered ring compounds having two hetero atoms such as pyridazine, pyrimidine, pyrazine and phthalzine, and condensed ring compounds of the same; and the like.

The substituent that gives the substituted form of the group is exemplified by halogen atoms such as a fluorine atom, a chlorine atom, a bromine atom and an iodine atom, an oxyhydrocarbon group, an amino group, a substituted amino group and the like.

The compound having a sulfonate group represented by the above formula (E) is exemplified by a compound represented by the following formula, and the like.

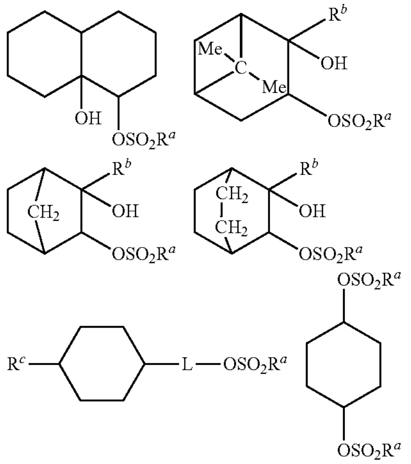

In the above formula, $R^a$ is as defined in the above formula (E); $R^b$ represents a hydrogen atom, a chain monovalent organic group, a monovalent organic group having an alicyclic structure or a monovalent organic group having an aromatic ring structure; $R^c$ represents a chain monovalent organic group, a monovalent organic group having an alicyclic structure, or a monovalent organic group having an aromatic ring structure; and L represents a single bond or a divalent organic group.

The chain organic group, the organic group having an alicyclic structure and the organic group having an aromatic ring structure represented by $R^b$ and $R^c$ are exemplified by groups similar to those exemplified as each group represented by $R^a$ in the above formula (E), and the like.

Of these, $R^b$ represents preferably the chain organic group, the organic group having an alicyclic structure and the organic group having an aromatic ring structure.

As the chain monovalent organic group represented by $R^c$, an alkyl group which may have a fluorine atom, and a cycloalkyl group which may have a fluorine atom are preferred. Examples of these groups include a methyl group, an ethyl group, a n-propyl group, an isopropyl group, a n-butyl group, a t-butyl group, a n-pentyl group, a cyclopentyl group, a n-hexyl group, a cyclohexyl group, a n-octyl group, a trifluoromethyl group, a pentafluoroethyl group, a perfluorobutyl group, a perfluoro-t-butyl group, a perfluoropentyl group, a perfluorocyclopentyl group, a perfluorohexyl group, a perfluorocyclohexyl group, a perfluorobutyl group, and the like.

As the divalent organic group represented by L, a group represented by the following formula group is preferred.

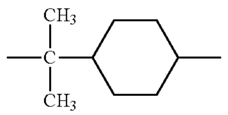

The acid increment agent is exemplified by compounds represented by the following formulae, and the like.

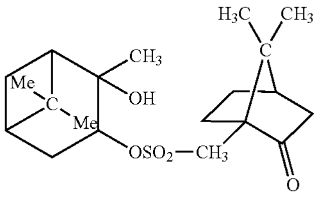
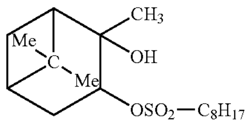
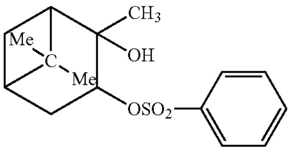
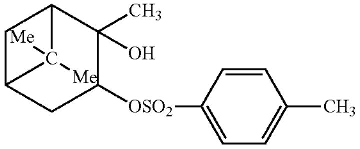
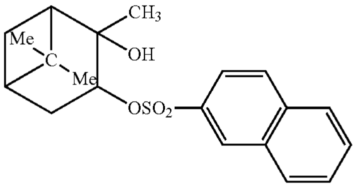
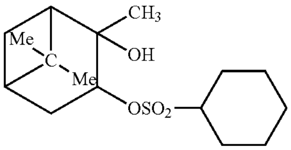
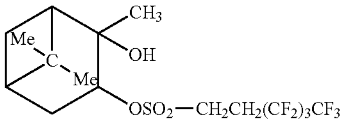
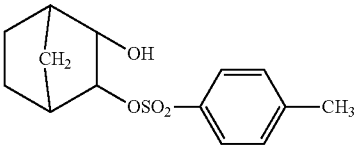
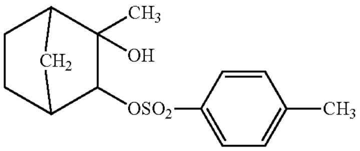
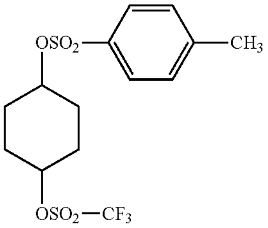
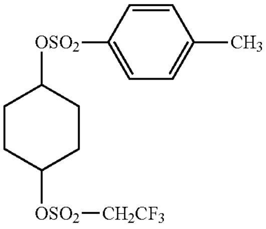
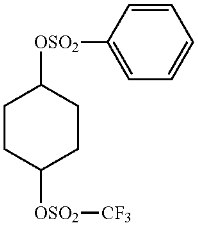
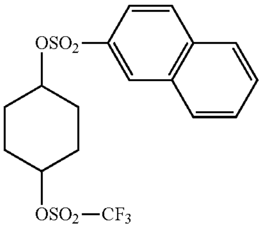
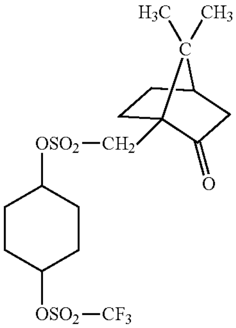
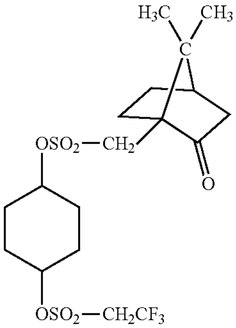
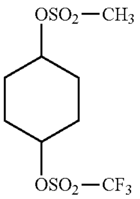
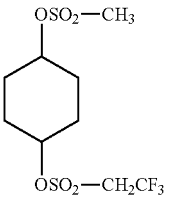
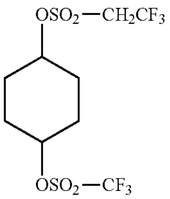
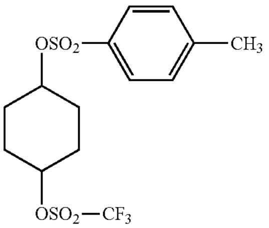
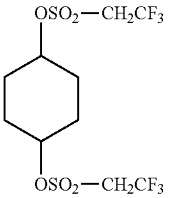
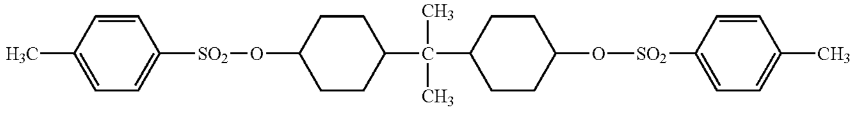

In a case where the acid incrementor is the acid increment agent, the content of the acid incrementor in the composition (I-A) with respect to 100 parts by mass of the polymer (I) is, in light of effective refining of the pattern by the pattern-forming method, preferably no less than 0 parts by mass, and more preferably no less than 1 part by mass. On the other hand, the content of the acid incrementor in the composition (I-A) is preferably no greater than 20 parts by mass, and more preferably no greater than 10 parts by mass.

Composition (I-B)

The composition (I-B) contains the polymer (I) having a solubility in the organic solvent to be decreased by an action of an acid, and a basic compound (hereinafter, may be also referred to as "(q) basic compound" or "basic compound (q)"). Similarly to the composition (I-A), the composition (I-B) preferably contains the solvent (i), and also may contain other component(s) such as the acid incrementor, in addition to these components. The polymer (I) is as already described above.

(q) Basic Compound

The basic compound (q) is not particularly limited as long as it is basic, and is preferably, for example, at least one selected from the group consisting of a compound represented by the following formula (X) (hereinafter, may be also referred to as "compound (X)") and a compound represented by the following formula (Y) (hereinafter, may be also referred to as "compound (Y)").

$$X^+ \quad Y^- \qquad (X)$$

(Y)

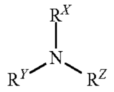

In the above formula (X), $X^+$ represents a monovalent onium cation; and $Y^-$ represents a monovalent carboxylate anion or a monovalent sulfonamide anion.

In the above formula (Y), $R^X$, $R^Y$ and $R^Z$ each independently represent an unsubstituted, hydroxy-substituted or amino-substituted monovalent chain hydrocarbon group having 1 to 20 carbon atoms or an unsubstituted, hydroxy-substituted or amino-substituted monovalent alicyclic hydrocarbon group having 3 to 20 carbon atoms, or at least two of $R^X$, $R^Y$ and $R^Z$ taken together represent an aliphatic heterocyclic structure having 3 to 20 ring atoms together with the nitrogen atom to which the at least two groups bond and the rest of $R^X$, $R^Y$ and $R^Z$ represents an unsubstituted, hydroxy-substituted or amino-substituted monovalent chain hydrocarbon group having 1 to 20 carbon atoms or an unsubstituted, hydroxy-substituted or amino-substituted monovalent alicyclic hydrocarbon group having 3 to 20 carbon atoms.

The monovalent onium cation represented by $X^+$ is exemplified by a sulfonium cation, an iodonium cation, an ammonium cation, an oxonium cation, and the like.

The monovalent carboxylate anion which may be represented by $Y^-$ is exemplified by a salicylate anion, and the like.

The monovalent sulfonamide anion which may be represented by $Y^-$ is exemplified by a trifluoromethyl sulfonamide ion, and the like.

The unsubstituted monovalent chain hydrocarbon group having 1 to 20 carbon atoms and unsubstituted monovalent alicyclic hydrocarbon group having 3 to 20 carbon atoms which may be represented by $R^X$, $R^Y$ and $R^Z$ is exemplified by groups similar to those exemplified as $R^{p1}$, $R^{p2}$ and $R^{p3}$ in the above formula (i), respectively, and the like.

Examples of the hydroxy-substituted monovalent chain hydrocarbon group having 1 to 20 carbon atoms which may be represented by $R^X$, $R^Y$ and $R^Z$ include:

hydroxyalkyl groups such as a hydroxymethyl group, a hydroxyethyl group, a hydroxypropyl group and a hydroxybutyl group;

hydroxyalkenyl groups such as a hydroxyethenyl group and a hydroxypropenyl group; and the like.

Examples of the hydroxy-substituted monovalent alicyclic hydrocarbon group having 3 to 20 carbon atoms which may be represented by $R^X$, $R^Y$ and $R^Z$ include:

hydroxycycloalkyl groups such as a hydroxycyclopentyl group, a hydroxycyclohexyl group, a hydroxynorbornyl group and a hydroxyadamantyl group;

hydroxycycloalkenyl groups such as a hydroxycyclopentenyl group and a hydroxycyclohexenyl group; and the like.

Examples of the amino-substituted monovalent chain hydrocarbon group having 1 to 20 carbon atoms which may be represented by $R^X$, $R^Y$ and $R^Z$ include:

aminoalkyl groups such as an aminomethyl group, an aminoethyl group, an aminopropyl group and an aminobutyl group;

aminoalkenyl groups such as an aminoethenyl group and an aminopropenyl group; and the like.

Examples of the amino-substituted monovalent alicyclic hydrocarbon group having 3 to 20 carbon atoms which may be represented by $R^X$, $R^Y$ and $R^Z$ include:

aminocycloalkyl groups such as an aminocyclopentyl group, an aminocyclohexyl group, an aminonorbornyl group and an aminoadamantyl group;

aminocycloalkenyl groups such as an aminocyclopentenyl group and an aminocyclohexenyl group; and the like.

Examples of the aliphatic heterocyclic structure having 3 to 20 ring atoms which may be taken together represented by at least two of $R^X$, $R^Y$ and $R^Z$ together with the nitrogen atom to which the at least two groups bond include:

azacycloalkane structures such as an azacyclopropane structure, an azacyclobutane structure, an azacyclopentane structure, an azacyclohexane structure, an azacyclooctane structure, an azacyclodecane structure, an azanorbornane structure and an azaadamantane structure;

azaoxacycloalkane structures such as an azaoxacyclopentane structure, an azaoxacyclohexane structure, an azaoxacyclooctane structure and an azaoxanorbornane structure;

diazacycloalkane structures such as a diazacyclopentane structure, a diazacyclohexane structure, a diazacyclooctane structure, a diazacyclodecane structure, a diazanorbornane structure and a diazabicyclo[2.2.2]octane structure; and the like.

Examples of the compound (X) include:

onium carboxylate compounds such as triphenylsulfonium salicylate, tetra-n-octylammonium salicylate, triphenylsulfonium acetate, triphenylsulfonium adamantyloxalate and tetra-n-octylammonium adamantyloxalate;

onium sulfonamide compounds such as triphenylsulfonium n-butyltrifluoromethylsulfonamide, tetra-n-octylammonium n-butyltrifluoromethylsulfonamide, triphenylsulfonium acesulfame (triphenylsulfonium 6-methyl-2.2-dioxo-oxathiazine-4-olate) and tetra-n-octylammonium acesulfame (tetra-n-octylammonium 6-methyl-2.2-dioxo-oxathiazine-4-olate); and the like.

Example of the compound (Y) include:

monoamine compounds such as tri-n-pentylamine, tri-n-octylamine and tricyclohexylamine;

diamine compounds such as diazabicyclo[2.2.2]octane and N,N-dimethylethylenediamine;

hydroxy-substituted amine compounds such as 4-hydroxy-1,2,2,6,6-pentamethylpiperidine and triethanolamine; and the like.

The lower limit of the content of the basic compound (q) with respect to 100 parts by mass of the polymer (I) is preferably 0.1 parts by mass, more preferably 0.5 parts by mass, still more preferably 1 part by mass, and particularly preferably 3 parts by mass. The upper limit of the content of the basic compound (q) with respect to 100 parts by mass of the polymer (I) is preferably 30 parts by mass, more preferably 20 parts by mass, still more preferably 15 parts by mass, and particularly preferably 12 parts by mass. When the content of the basic compound (q) falls within the above range, the shape of the pattern obtained can be even more favorable.

In a case where the polymer constituting the prepattern has the acid-labile group, it is preferred that the basic group and the basic compound (q) have their basicity greater than the basicity of the conjugated base of the acidic group generated by dissociation of the acid-labile group. When the basic group and the basic compound having such a property are used, a pattern having a more favorable shape can be formed according to the pattern-forming method.

Insolubilizing or Desolubilizing Step

Figure 1C:
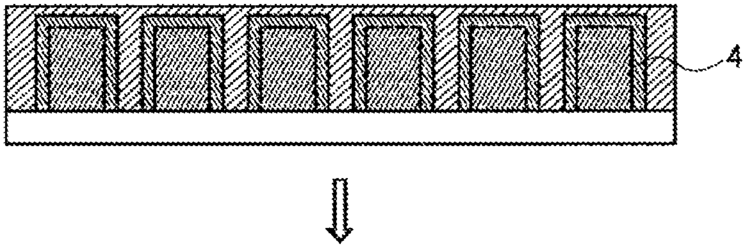

In this step, adjacent regions to the prepattern of the resin layer are insolubilized or desolubilized in the organic solvent, without being accompanied by an increase in the molecular weight by heating the prepattern and the resin layer. According to this step, in adjacent regions to the prepattern of the resin layer 3, adjacent regions 4 that are insoluble or hardly soluble in the organic solvent are formed as shown in FIG. 1C. The phrase "without being accompanied by an increase in the molecular weight" as referred to means that owing to e.g., the absence of generation of a novel covalent bond between the polymer constituting the prepattern and the polymer constituting the resin layer, each molecular weight of these polymers does not substantially increase. In this step, it is presumed that e.g., heating of the prepattern and the resin layer would result in a diffusion of the acid, etc., contained in the prepattern, for example, into the adjacent regions to the prepattern of the resin layer, and then the polymer that is present in the adjacent regions would be insolubilized or desolubilized in the organic solvent due to the action of the acid.

The heating procedure is exemplified by heating on a hot plate, and the like. The heating temperature is preferably no less than 50° C. and no greater than 250° C. The heating time period is preferably no less than 10 sec and no greater than 10 min. The heating atmosphere may be either in the air, or in an inert gas such as nitrogen or argon.

Removing Step

Figure 1D:
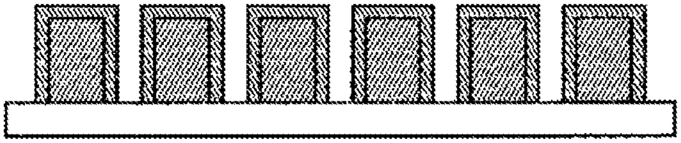

In this step, regions other than the adjacent regions of the resin layer are removed with the organic solvent. Accordingly, a refined pattern can be obtained as shown in FIG. 1D.

The organic solvent for use in the removing is not particularly limited as long as it does not dissolve the prepattern and the adjacent regions, but dissolves the composition (I), and for example, one, or two or more types of the organic solvent exemplified in connection with the prepattern-forming step may be used. Also, an organic solvent that is the same as the solvent contained in the composition (I) may be used.

Rinsing Step

In this step, rinsing is carried out with an organic solvent that is different from the organic solvent used in the removing step. The organic solvent used in this step is not particularly limited as long as it differs from the organic solvent used in the removing step. For example, one, or two or more types of the organic solvents among those exemplified in connection with the prepattern-forming step may be used. Of these organic solvents, in light of making the obtained shape of the pattern more favorable, the organic solvent that is less polar than the organic solvent used in the removing step may be preferably used.

According to the pattern-forming method, a resist pattern having a fine and favorable shape can be formed by a convenient method through carrying out the steps as in the foregoing.

Pattern-Forming Method (a)

The pattern-forming method (a) is also one suitable embodiment of the present invention.

The pattern-forming method (a) includes prepattern-forming step, the contacting step, the resin layer-forming step, the insolubilizing or desolubilizing step, and the removing step, wherein the resin layer is formed from the composition (I) containing the polymer (I), and the polymer (I) has an Mw of no less than 13,000 and no greater than 150,000.

According to the pattern-forming method (a), a resist pattern having a fine and favorable shape can be formed with the convenient method, substantially irrespective of the pattern type, through the use of the composition containing the polymer having the Mw falling within the above specified range, and the contacting step of bringing into contact with at least lateral faces of the prepattern, the composition which contains the basic compound and the organic solvent, and which does not contain the polymer having a solubility in an organic solvent to be decreased by an action of an acid. This advantage is presumed to result from, for example, adhesion of the basic compound to the prepattern by bringing the composition into contact with the at least lateral faces of the prepattern, followed by formation of regions including anionic groups such as a carboxylate group in adjacent regions formed in subsequent resin layer-forming step and insolubilizing or desolubilizing step, wherein the anionic groups are derived from the acidic groups such as the carboxy group constituting the adjacent regions due to the basic compound, thereby leading to an increase of the extent of the desolubilization of the adjacent regions in the organic solvent used in the removing step. In addition, it is believed that the pattern having a finer and more favorable shape can be formed due to the Mw of the polymer (I) falling within the above specified range.

Each step and the polymer (I) of the pattern-forming method (a) are as described herein in connection with the pattern-forming method above.

Composition for Resist Pattern-Refinement

The mode of the composition for resist pattern-refinement may involve the following compositions (A) to (C):

composition (A): containing the polymer having a basic group and having a solubility in an organic solvent to be decreased by an action of an acid;

composition (B): containing the polymer having a solubility in an organic solvent to be decreased by an action of an acid, and the basic compound; and composition (C): containing the basic compound and the organic solvent, and not containing the polymer having a solubility in an organic solvent to be decreased by an action of an acid.

It is preferred that the polymer contained in the composition (A) and the composition (B) has an aromatic ring. In addition, the proportion of the structural unit having the aromatic ring contained with respect to the total structural units is preferably no less than 20 mol %.

The polymer contained in the composition (A) and composition (B) preferably has an Mw of no less than 13,000 and no greater than 150,000.

The composition for resist pattern-refinement is described herein above, i.e., the composition (A): as the composition (I-A) that involves the feature (i) in connection with the pattern-forming method; the composition (B): as the composition (I-B) that involves feature (ii); and the composition (C): as the composition (II) in connection with the pattern-forming method.

EXAMPLES

Hereinafter, the present invention is explained in detail by way of Examples, but, the present invention is not in any way limited to these Examples.

Synthesis of Polymer

The polymer (a) and the polymer (d) for use in the preparation of the resist composition, and the monomer compound and the polymerization initiator used in the synthesis of the polymer (I) for use in the preparation of the composition for resist pattern-refinement are shown in the following.

(M-1)

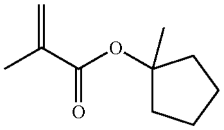

(M-2)

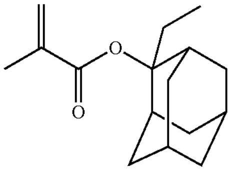

(M-3)

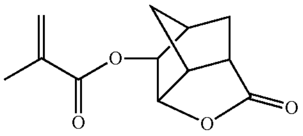

(M-4)

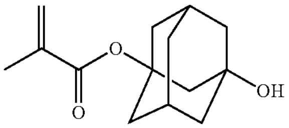

(M-5)

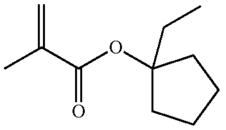

(M-6)

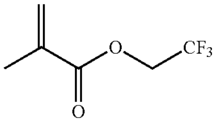

(M-7)

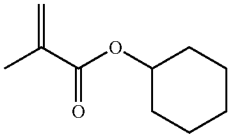

(M-8)

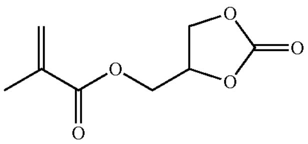

-continued (M-9)

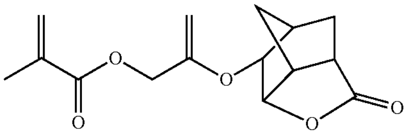

(M-10)

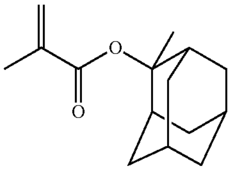

(M-11)

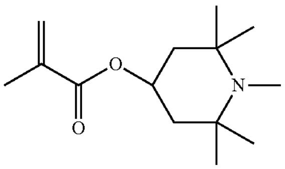

(M-12)

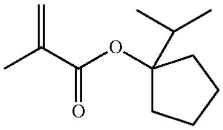

(M-13)

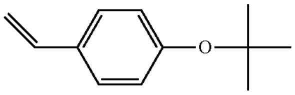

(M-14)

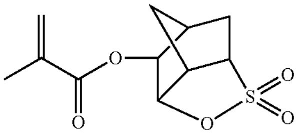

(M-15)

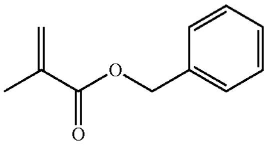

(Z-1)

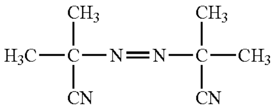

(Z-2)

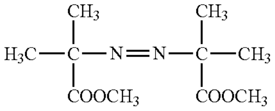

(Z-3)

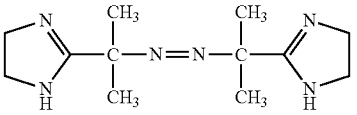

Synthesis of Polymer (a)

Synthesis Example 1: Synthesis of Polymer (A-1)

A monomer solution was prepared by dissolving 40 mol % of the compound (M-1), 10 mol % of the compound (M-2), 40 mol % of the compound (M-3), 10 mol % of the compound (M-4), and 5 mol % of the compound (Z-1) as a polymerization initiator in 60 g of methyl ethyl ketone. It is to be noted that the mol % of each monomer compound is the proportion with respect to the total monomer compounds, and the mol % of the polymerization initiator is the proportion with respect to the total number of moles of the entire monomer compounds and the polymerization initiator. In addition, the total mass of the monomer compounds was adjusted to be 30 g. Next, 30 g of methyl ethyl ketone was charged into a 500 mL three-neck flask equipped with a thermometer and a dropping funnel, and purged with nitrogen for 30 min. Thereafter, the flask was heated to 80° C. while the mixture was stirred with a magnetic stirrer. Then, the monomer solution which had been prepared as described above was added dropwise into the three-neck flask over 3 hrs by using the dropping funnel. The time of the start of the dropwise addition was regarded as the time of the start of the polymerization reaction, and the polymerization reaction was allowed to proceed for 6 hrs. Thereafter, the polymerization reaction mixture was cooled to 30° C. or below, then the polymerization reaction mixture was poured into 600 g of methanol, and a precipitated white powder was filtered off. Thus collected white powder was washed twice with each 120 g of methanol to give a slurry state, followed by separation by filtration, and dried at 50° C. for 17 hrs to obtain a polymer (A-1) as a white powder (product amount: 23.3 g, yield: 77.6%). The polymer (A-1) had an Mw of 6,200 and an Mw/Mn of 1.62. In addition, the result of $^{13}$C-NMR analysis indicated that the proportions of the structural units derived from (M-1), (M-2), (M-3) and (M-4) in the polymer (A-1) were 40.2 mol %, 9.0 mol %, 41.1 mol % and 9.7 mol %, respectively.

Synthesis of Polymer (d)

Synthesis Example 2: Synthesis of Polymer (D-1)

A monomer solution was prepared by dissolving 70 mol % of the compound (M-5), 30 mol % of the compound (M-6), and 8 mol % of the compound (Z-2) as a polymerization initiator in 100 g of methyl ethyl ketone. It is to be noted that the mol % of each monomer compound is the proportion with respect to the total monomer compounds, and the mol % of the polymerization initiator is the proportion with respect to the total number of moles of the entire monomer compounds and the polymerization initiator. In addition, the total mass of the monomer compounds was adjusted to be 50 g. Next, a 500 mL three-neck flask containing 100 g of methyl ethyl ketone was purged with nitrogen for 30 min, then heated to 80° C. with stirring, and the monomer solution which had been prepared as described above was added dropwise over 3 hrs using a dropping funnel. The time of the start of the dropwise addition was regarded as the time of the start of the polymerization reaction, and the polymerization reaction was allowed to proceed for 6 hrs. After the completion of the polymerization reaction, the polymerization reaction mixture was water-cooled to 30° C. or below. After washing the polymerization reaction mixture with 825 g of a mixed solution of methanol/methyl ethyl ketone/hexane=2/1/8 (mass ratio), the solvent was substituted with propylene glycol monomethyl ether acetate to obtain a solution containing a polymer (D-1) (amount of obtained polymer: 38.0 g, yield: 76.0%). The polymer (D-1) had an Mw of 7,000, and an Mw/Mn of 1.40. In addition, the result of $^{13}$C-NMR analysis indicated that the proportions of the structural units derived from (M-5) and (M-6) in the polymer (D-1) were 70.2 mol % and 29.8 mol %, respectively.

TABLE 1

| | | Monomer that gives structural unit (I) | | | Monomer that gives structural units (II) to (IV) | | | Polymerization initiator | | | | |
|---|---|---|---|---|---|---|---|---|---|---|---|---|
| | Polymer | type | amount (mol %) | proportion of structural unit (mol %) | type | amount (mol %) | proportion of structural unit (mol %) | type | amount (mol %) | Yield (%) | Mw | Mw/Mn |
| Synthesis Example 1 | A-1 | M-1 | 40 | 40.2 | M-3 | 40 | 41.1 | Z-1 | 5 | 77.6 | 6,200 | 1.62 |
| | | M-2 | 10 | 9.0 | M-4 | 10 | 9.7 | | | | | |
| Synthesis Example 2 | D-1 | M-5 | 70 | 70.2 | M-6 | 30 | 29.8 | Z-2 | 8 | 76.0 | 7,000 | 1.40 |

Synthesis of Polymer (I)

Synthesis Examples 3 to 10: Synthesis of Polymers (I-1) to (I-8)

Polymers (I-1) to (I-8) were each synthesized by a similar operation to that of Synthesis Example 1 except that the type and the amount of the monomer compound and the polymerization initiator used were as shown in Table 2 below. The Mw, the Mw/Mn and the yield of each polymer, and the proportion of each structural unit contained in each polymer are shown together in Table 2. The symbol "-" in Table 2 indicates that the corresponding monomer was not used.

TABLE 2

| | | Monomer 1 | | | Monomer 2 | | | Monomer 3 | | | Polymerization initiator | | | | |
|---|---|---|---|---|---|---|---|---|---|---|---|---|---|---|---|
| | (I) Polymer | type | amount (mol %) | proportion of structural unit (mol %) | type | amount (mol %) | proportion of structural unit (mol %) | type | amount (mol %) | proportion of structural unit (mol %) | type | using amount (mol %) | Yield (%) | Mw | Mw/Mn |
| Synthesis Example 3 | I-1 | M-1 | 65 | 63.9 | M-3 | 35 | 36.1 | — | — | — | Z-1 | 2 | 82.3 | 14,000 | 2.33 |
| Synthesis Example 4 | I-2 | M-1 | 65 | 64.5 | M-3 | 35 | 35.5 | — | — | — | Z-1 | 5 | 78.0 | 6,300 | 1.82 |
| Synthesis Example 5 | I-3 | M-1 | 10 | 10.6 | M-7 | 60 | 61.9 | M-8 | 30 | 27.5 | Z-1 | 2 | 81.8 | 13,500 | 2.10 |
| Synthesis Example 6 | I-4 | M-1 | 50 | 51.1 | M-2 | 20 | 18.4 | M-9 | 30 | 30.5 | Z-1 | 1.5 | 83.5 | 22,000 | 2.68 |
| Synthesis Example 7 | I-5 | M-10 | 10 | 12.6 | M-11 | 60 | 58.5 | M-3 | 30 | 28.9 | Z-1 | 1 | 78.6 | 30,000 | 2.59 |
| Synthesis Example 8 | I-6 | M-12 | 70 | 69.7 | M-3 | 30 | 30.3 | — | — | — | Z-3 | 2 | 75.7 | 19,200 | 2.35 |
| Synthesis Example 9 | I-7 | M-12 | 40 | 42.7 | M-13 | 30 | 27.2 | M-14 | 30 | 30.1 | Z-1 | 1.5 | 77.2 | 25,000 | 2.55 |
| Synthesis Example 10 | I-8 | M-10 | 10 | 8.8 | M-15 | 60 | 58.3 | M-3 | 30 | 32.9 | Z-1 | 2 | 80.8 | 14,500 | 2.13 |

Preparation of Resist Composition

The acid generating agent (b), the solvent (c) and the acid diffusion control agent (e) used in the preparation of the resist composition, other than the polymer (a) and the polymer (d), are shown below.

(b) Acid Generating Agent

B-1: triphenylsulfonium 1,1-difluoro-2-((3-hydroxyadamantan-1-yl)methoxy)-2-oxoethanesulfonate (a compound represented by the following formula (B-1))

(B-1)

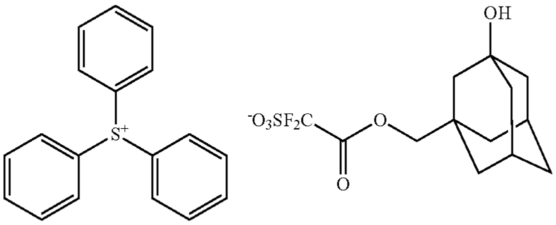

(c) Solvent

C-1: propylene glycol monomethyl ether acetate

C-2: cyclohexanone

C-3: γ-butyrolactone (e) Acid Diffusion Control Agent

E-1: tert-pentyl 4-hydroxypiperidine-1-carboxylate (a compound represented by the following formula (E-1))

(E-1)

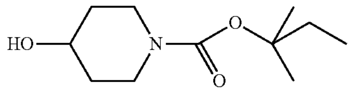

Preparation Example 1: Preparation of Resist Composition (J-1)

A resist composition (J-1) was prepared by mixing 100 parts by mass of the polymer (A-1) as the polymer (a), 7.8 parts by mass of the acid generating agent (B-1) as the acid generating agent (b), 2,510 parts by mass of the solvent (C-1), 1,075 parts by mass of the solvent (C-2) and 30 parts by mass of the solvent (C-3) as the solvent (c), 3 parts by mass of the polymer (D-1) as the polymer (d), and 0.8 parts by mass of the acid diffusion control agent (E-1) as the acid diffusion control agent (e).

TABLE 3

| | | (a) Polymer | | (b) Acid generating agent | | (c) Solvent | | (d) Polymer | | (e) Acid diffusion control agent | |
|---|---|---|---|---|---|---|---|---|---|---|---|
| | Resist composition | type | amount blended (parts by mass) | type | amount blended (parts by mass) | type | amount blended (parts by mass) | type | amount blended (parts by mass) | type | amount blended (parts by mass) |
| Preparation Example 1 | J-1 | A-1 | 100 | B-1 | 7.8 | C-1/C-2/C-3 | 2,510/1,075/30 | D-1 | 3 | E-1 | 0.8 |

Preparation of Composition for Resist Pattern-Refinement

The basic compound (q) and the solvent (p) used in the preparation of the composition for resist pattern-refinement, other than the polymer (I), are shown below.

(q) Basic Compound

Q-1: triphenylsulfonium n-butyltrifluoromethylsulfonamide (a compound represented by the following formula (Q-1))

Q-2: triphenylsulfonium salicylate (a compound represented by the following formula (Q-2))

Q-3: trioctylamine (a compound represented by the following formula (Q-3))

Q-4: 4-hydroxy-1,2,2,6,6-pentamethylpiperidine (a compound represented by the following formula (Q-4))

Q-5: diazabicyclo[2.2.2]octane (a compound represented by the following formula (Q-5))

Q-6: tetra-n-octylammonium salicylate (a compound represented by the following formula (Q-6))

(Q-1)

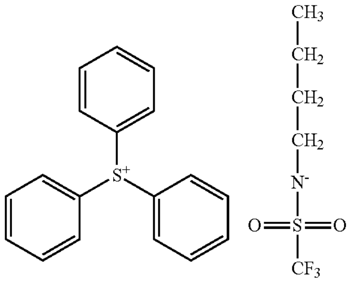

(Q-2)

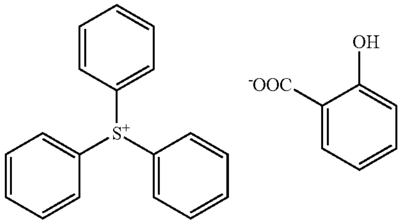

(Q-3)

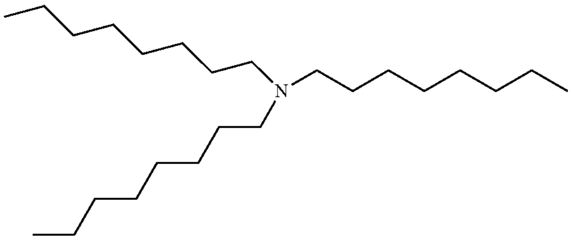

-continued (Q-4)

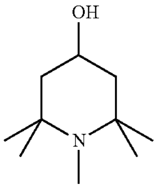

(Q-5)

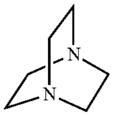

(Q-6)

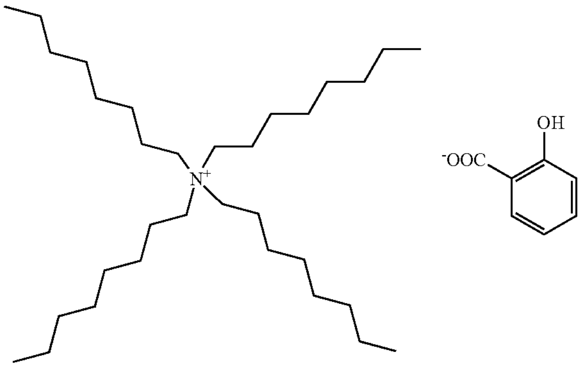

(p) Solvent

P-1: propylene glycol monomethyl ether acetate
P-2: cyclohexanone
P-3: butyl acetate (nBA)
P-4: 2-heptanone (MAK)

Preparation Example 2: Preparation of Composition for Resist Pattern-Refinement (S-1)

A composition for resist pattern-refinement (S-1) was prepared by mixing 100 parts by mass of (I-1) as the polymer (I), 8 parts by mass of (Q-1) as the basic compound (q), and 2,084 parts by mass of (P-1) and 894 parts by mass of (P-2) as the solvent (p).

Preparation Examples 3 to 13: Preparation of Compositions for Resist Pattern-Refinement (S-2) to (S-10) and (S-12) and (S-13)

Compositions for pattern-refinement (S-2) to (S-10) and (S-12) and (S-13) were each prepared by a similar operation to that of Preparation Example 1 except that the type and the amount of each component blended were as shown in Table 4 below.

TABLE 4

| | | (I) Polymer | | (q) Basic compound | | (p) Solvent | |
|---|---|---|---|---|---|---|---|
| | Composition for pattern-refinement | type | amount blended (parts by mass) | type | amount blended (parts by mass) | type | amount blended (parts by mass) |
| Preparation Example 2 | S-1 | I-1 | 100 | Q-1 | 8 | P-1/P-2 | 2,084/894 |
| Preparation Example 3 | S-2 | I-2 | 100 | Q-2 | 8 | P-3 | 3,892 |
| Preparation Example 4 | S-3 | I-3 | 100 | Q-2 | 12 | P-3 | 4,036 |
| Preparation Example 5 | S-4 | I-4 | 100 | Q-3 | 5 | P-1 | 2,520 |
| Preparation Example 6 | S-5 | I-5 | 100 | — | — | P-3 | 3,604 |
| Preparation Example 7 | S-6 | I-6 | 100 | — | — | P-3 | 3,604 |
| Preparation Example 8 | S-7 | I-7 | 100 | Q-4 | 5 | P-1/P-2 | 2,026/869 |
| Preparation Example 9 | S-8 | I-8 | 100 | Q-1 | 5 | P-4 | 3,784 |

TABLE 4-continued

| | Composition for pattern-refinement | (I) Polymer type | (I) Polymer amount blended (parts by mass) | (q) Basic compound type | (q) Basic compound amount blended (parts by mass) | (p) Solvent type | (p) Solvent amount blended (parts by mass) |
|---|---|---|---|---|---|---|---|
| Preparation Example 10 | S-9 | I-1 | 100 | Q-1 | 2 | P-1/P-2 | 1,968/844 |
| Preparation Example 11 | S-10 | I-1 | 100 | — | — | P-1/P-2 | 1,930/827 |
| Preparation Example 12 | S-12 | I-1 | 100 | Q-5 | 5 | P-1/P-2 | 2,026/869 |
| Preparation Example 13 | S-13 | I-3 | 100 | Q-6 | 12 | P-3 | 4,036 |

Formation of Pattern

Example 1: Formation of Prepattern

An underlayer antireflective film having a thickness of 105 nm was provided on a 12-inch silicon wafer by spin-coating an antireflective film-forming agent ("ARC66" available from Nissan Chemical Industries, Ltd.) with a coater/developer ("CLEAN TRACK Lithius Pro i" available from Tokyo Electron Limited), followed by baking at 205° C. for 60 sec. On the substrate provided with the underlayer antireflective film, the resist composition (J-1) prepared as described above was spin-coated with a coater/developer ("CLEAN TRACK ACT12" available from Tokyo Electron Limited), followed by soft baking (SB) at 80° C. for 60 sec and then cooling at 23° C. for 30 sec to form a resist film having a film thickness of 70 nm.

Next, a reduced projection exposure was carried out through a hole pattern mask by using ArF Immersion Scanner ("NSR-S610C" available from Precision Equipment Company, Nikon Corporation), under optical conditions involving a numerical aperture (NA) of 1.3, with cloth pole such that a pattern of 50 nm hole/125 nm pitch and a pattern of 50 nm hole/1,000 nm pitch were formed. After the exposure, post exposure baking (PEB) was carried out on a hot plate of the "CLEAN TRACK Lithius Pro i" at 95° C. for 60 sec, followed by cooling at 23° C. for 30 sec.

Then, a puddle development was carried out by using n-butyl acetate as a developer solution for 25 sec, and subsequently, a rinse treatment was carried out by using 4-methyl-2-pentanol as a rinse agent for 7 sec. Thereafter, spin-drying at 2,000 rpm for 15 sec resulted in formation of 50 nm hole/125 nm pitch and 50 nm hole/1,000 nm pitch prepatterns.

Pattern Slimming

The composition for resist pattern-refinement (S-1) was spin-coated on the prepattern by using the coater/developer ("CLEAN TRACK ACT12" available from Tokyo Electron Limited), followed by heating at 120° C. for 60 sec, and then cooling at 23° C. for 30 sec resulted in formation of a resin layer on the surface of the prepattern.

Then, regions other than the adjacent regions were removed by a puddle procedure using n-butyl acetate as an organic solvent for 25 sec, and subsequently, rinsed with 4-methyl-2-pentanol (MIBC) as a rinse agent for 7 sec. Thereafter, spin-drying was carried out at 2,000 rpm for 15 sec.

Examples 2 to 8, 11 and 12, and Comparative Example 1

Patterns were formed by a similar operation to that in Example 1 except that the composition for resist pattern-refinement employed, the heating temperature and time period were as shown in Table 5 below. In Table 5, "-" indicates that the contacting step was not carried out.

Example 9

Contacting Step

On a prepattern obtained in a similar manner to Example 1, a 0.3% by mass solution in MIBC of (Q-4) as the basic compound (q) was spin-coated by using "CLEAN TRACK ACT12".

Pattern Slimming

A similar operation to that of Example 1 was carried out on the prepattern after subjecting to the contacting step was except that (S-9) was used as the composition for resist pattern-refinement to form a pattern.

Example 10

A pattern was formed in a similar manner to Example 9 except that (S-10) was used as the composition for resist pattern-refinement employed.

Comparative Example 2

Pattern Slimming

On a prepattern obtained in a similar manner to Example 1, a composition (S-11, a crosslinking layer-forming material (B5) disclosed in Example 10 of Japanese Patent No. 4558064) prepared by mixing 5.5 parts by mass of a poly-p-hydroxystyrene resin ("VP8000" available from Nippon Soda Co., Ltd.), 3 parts by mass of a hexamethoxymethylmelamine resin ("Cymel300" available from Kyoeisha Chemical Co., Ltd.) and 190 parts by mass of 1-butanol was spin-coated by using "CLEAN TRACK ACT12", and heated at 155° C. for 90 sec, followed by cooling at 23° C. for 30 sec. Next, a puddle procedure was carried out on "CLEAN TRACK Lithius Pro i" with a 2.38% by mass aqueous TMAH solution for 60 sec, and subsequently ultra pure water was used as a rinse agent to execute a rinse treatment, followed by baking at 90° C. for 90 sec to form a pattern.

Evaluations

The amount of dimension reduction of a hole pattern, and the pattern type dependency were evaluated on the pattern obtained as described above, according to the following method. Thus obtained results of the evaluations are shown together in Table 5 below.

Amount of Dimension Reduction

A hole pattern of 125 nm pitch and 1,000 nm pitch formed as described above was observed using a scanning electron microscope ("CG4000" available from Hitachi High-Technologies Corporation) to determine the hole size of the prepattern and the hole size of the pattern after subjecting to the pattern slimming step, and the difference therebetween was calculated to define the amount of dimension reduction (nm).

Pattern Type Dependency

In the evaluation of the amount of dimension reduction, the difference between the amount of dimension reduction for 125 nm pitch hole, and the amount of dimension reduction for 1,000 nm pitch hole was determined as the pattern type dependency (nm). The pattern type dependency was evaluated to be: "favorable" when the difference was less than 5 nm; and "unfavorable" when the difference was no less than 5 nm.

Etching Resistance

The etching rate of the film formed from each composition for resist pattern-refinement was determined by using a dry etching apparatus ("Telius SCCM" available from Tokyo Electron Limited), and the evaluation was made by comparing with the etching rate of the film formed from the resist composition employed for the prepattern to be: "A" when etching rate of the film formed from the composition for resist pattern-refinement was less; "B" when the etching rates were equivalent; and "C" when etching rate of the film formed from the composition for resist pattern-refinement was grater.

the prepattern was converted into an ionic group such as a carboxylate group due to the basicity of the composition for resist pattern-refinement, and thus the adjacent regions became more hardly soluble in organic solvents, thereby enabling the amount of dimension reduction suited for fine pattern formation to be attained. Moreover, the polymer of composition for resist pattern-refinement having a structural unit that includes an aromatic ring, further enhances the etching resistance of the pattern.

According to the pattern-forming methods and the compositions for resist pattern-refinement of the embodiments of the present invention, a resist pattern having a fine and favorable shape can be formed substantially irrespective of the pattern type by a convenient process. Therefore, these can be suitably used for pattern formation in the fields of semiconductor processing and the like in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

TABLE 5

| | Composition for resist pattern-refinement | Baking temperature temperature (° C.) | Baking temperature time period (sec) | Contacting step | Amount of dimension reduction (nm) 125 nm pitch | Amount of dimension reduction (nm) 1,000 nm pitch | Pattern type dependency | Etching resistance |
|---|---|---|---|---|---|---|---|---|
| Example 1 | S-1 | 120 | 60 | — | 18 | 20 | favorable | B |
| Example 2 | S-2 | 140 | 60 | — | 13 | 14 | favorable | B |
| Example 3 | S-3 | 100 | 60 | — | 22 | 21 | favorable | B |
| Example 4 | S-4 | 80 | 60 | — | 18 | 18 | favorable | A |
| Example 5 | S-5 | 150 | 60 | — | 20 | 19 | favorable | B |
| Example 6 | S-6 | 90 | 60 | — | 15 | 16 | favorable | B |
| Example 7 | S-7 | 100 | 60 | — | 16 | 16 | favorable | A |
| Example 8 | S-8 | 180 | 60 | — | 25 | 26 | favorable | A |
| Example 9 | S-9 | 120 | 60 | basic compound (Q-4) 0.3% by mass MIBC solution | 23 | 24 | favorable | B |
| Example 10 | S-10 | 120 | 60 | basic compound (Q-4) 0.3% by mass MIBC solution | 18 | 19 | favorable | B |
| Example 11 | S-12 | 120 | 60 | — | 17 | 19 | favorable | B |
| Example 12 | S-13 | 100 | 60 | — | 20 | 18 | favorable | B |
| Comparative Example 1 | S-10 | 120 | 60 | — | pattern absent | | | |
| Comparative Example 2 | S-11 | 155<br>90 | 90<br>90 | — | 9 | 28 | unfavorable | B |

As is clear from the results shown in Table 5, less pattern type dependency of the amount of dimension reduction was exhibited according to the pattern-forming method of Examples, as compared with a conventional pattern-forming method demonstrated by Comparative Example 2. Therefore, the pattern-forming method of Examples can be suitably used also in formation of a pattern layout in which various patterns are present admixed. In addition, in cases where: the composition for resist pattern-refinement did not contain the basic group or basic compound; and the step of bringing the composition (II) containing the basic compound and organic solvent and not containing the polymer having a solubility in an organic solvent to be decreased by an action of an acid was not carried out, as in Comparative Example 1, impairment of the amount of dimension reduction, and deterioration of the pattern occurred which would result from dissolution of the prepattern. According to the pattern-forming method of Examples of the present invention, the acidic group such as a carboxy group included in

What is claimed is:

1. A pattern-forming method comprising:

forming a prepattern that is insoluble or that has a low solubility such that a shape of the prepattern is substantially maintained in an organic solvent;

applying a first composition on at least lateral faces of the prepattern to form a resin layer;

insolubilizing or desolubilizing in the organic solvent, regions adjacent to and in contact with the prepattern of the resin layer without being accompanied by an increase in a molecular weight by heating the prepattern and the resin layer; and removing regions other than the regions insolubilized or desolubilized of the resin layer with the organic solvent, wherein, the first composition comprises a first polymer having a solubility in the organic solvent to be decreased by an action of an acid, and at least one selected from the following features (i) and (ii) is satisfied:

(i) the first polymer comprises a basic group; and (ii) the first composition further comprises a basic compound.

2. The pattern-forming method according to claim 1, wherein the first polymer comprises a structural unit comprising an aromatic ring having 6 to 30 carbon atoms, and a proportion of the structural unit with respect to total structural units constituting the first polymer is no less than 20 mol %.

3. The pattern-forming method according to claim 1, wherein a weight average molecular weight of the first polymer is no less than 13,000 and no greater than 150,000.

4. The pattern-forming method according to claim 1, wherein the prepattern comprises an acid.

5. The pattern-forming method according to claim 1, wherein the forming of the prepattern comprises:

applying a resist composition on a substrate to form a resist film, the resist composition comprising a second polymer and a radiation-sensitive acid generator, the second polymer having a solubility in the organic solvent to be decreased by an action of an acid;

exposing the resist film; and developing the exposed resist film with a developer solution comprising the organic solvent.

6. The pattern-forming method according to claim 1, wherein the first polymer comprises an acid-labile group.

7. The pattern-forming method according to claim 1, wherein the basic group is a group represented by formula (a), a group represented by formula (b) or a combination thereof, (a)

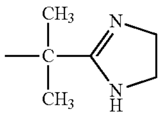

(b)

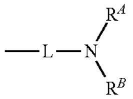

wherein, in the formula (b), L represents a single bond, a divalent chain hydrocarbon group having 1 to 20 carbon atoms or a divalent alicyclic hydrocarbon group having 3 to 20 carbon atoms; and $R^A$ and $R^B$ each independently represent a hydrogen atom, a monovalent chain hydrocarbon group having 1 to 20 carbon atoms or a monovalent alicyclic hydrocarbon group having 3 to 20 carbon atoms, or L and $R^A$ optionally taken together represent an aliphatic heterocyclic structure having 3 to 20 ring atoms together with the nitrogen atom to which L and $R^A$ bond.

8. The pattern-forming method according to claim 1, further comprising after the forming of the prepattern and before the forming of the resin layer, bringing into contact with at least lateral faces of the prepattern, a second composition which comprises a basic compound and an organic solvent and which does not comprise a polymer having a solubility in an organic solvent to be decreased by an action of an acid.

9. The pattern-forming method according to claim 1, wherein the basic compound is represented by formula (X), a compound represented by formula (Y) or a combination thereof, $$X^+ \ Y^- \quad (X)$$

(Y)

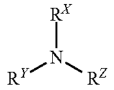

wherein, in the formula (X), $X^+$ represents a monovalent onium cation; and $Y^-$ represents a monovalent carboxylate anion or a monovalent sulfonamide anion, and in the formula (Y), $R^X$, $R^Y$ and $R^Z$ each independently represent an unsubstituted, hydroxy-substituted or amino-substituted monovalent chain hydrocarbon group having 1 to 20 carbon atoms or an unsubstituted, hydroxy-substituted or amino-substituted monovalent alicyclic hydrocarbon group having 3 to 20 carbon atoms, or at least two of $R^X$, $R^Y$ and $R^Z$ taken together represent an aliphatic heterocyclic structure having 3 to 20 ring atoms together with the nitrogen atom to which the at least two of $R^X$, $R^Y$ and $R^Z$ bond and the rest of $R^X$, $R^Y$ and $R^Z$ represents an unsubstituted, hydroxy-substituted or amino-substituted monovalent chain hydrocarbon group having 1 to 20 carbon atoms or an unsubstituted, hydroxy-substituted or amino-substituted monovalent alicyclic hydrocarbon group having 3 to 20 carbon atoms.

10. The pattern-forming method according to claim 1, wherein the first composition further comprises an acid incrementor.

11. The pattern-forming method according to claim 1, wherein the first polymer further comprises a hydroxy group, a carboxy group, an oxo group, a group comprising a lactone structure, a group comprising a cyclic carbonate structure, a group comprising a sultone structure, or a combination thereof.

12. The pattern-forming method according to claim 1, wherein the prepattern is a line-and-space pattern or a hole pattern.

13. The pattern-forming method according to claim 1 further comprising after the removing, rinsing with an organic solvent that is different from the organic solvent used in the removing.

14. A pattern-forming method comprising:

forming a prepattern that is insoluble or that has a low solubility such that a shape of the prepattern is substantially maintained in an organic solvent;

bringing into contact with at least lateral faces of the prepattern, a composition which comprises a basic compound and an organic solvent and which does not comprise a polymer having a solubility in an organic solvent to be decreased by an action of an acid;

applying a composition on at least lateral faces of the prepattern to form a resin layer, the composition comprising a polymer having a solubility in the organic solvent to be decreased by an action of an acid, the polymer having a weight average molecular weight of no less than 13,000 and no greater than 150,000;

insolubilizing or desolubilizing in the organic solvent, regions adjacent to and in contact with the prepattern of the resin layer without being accompanied by an increase in a molecular weight by heating the prepattern and the resin layer; and removing regions other than the regions insolubilized or desolubilized of the resin layer with the organic solvent.

* * * * *